United States Patent
Kanno et al.

(10) Patent No.: US 9,279,919 B2
(45) Date of Patent: Mar. 8, 2016

(54) LIGHT DIFFUSING MEMBER COMPRISING HOLLOW PORTIONS AND A PLURALITY OF LIGHT-SHIELDING LAYERS DOTTED ON ONE SURFACE OF A BASE MATERIAL, METHOD FOR MANUFACTURING THE SAME AND DISPLAY DEVICE

(71) Applicant: Sharp Kabushiki Kaisha, Osaka-shi, Osaka (JP)

(72) Inventors: Toru Kanno, Osaka (JP); Emi Yamamoto, Osaka (JP); Tsuyoshi Maeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/382,859

(22) PCT Filed: Mar. 12, 2013

(86) PCT No.: PCT/JP2013/056811
§ 371 (c)(1),
(2) Date: Sep. 4, 2014

(87) PCT Pub. No.: WO2013/146230
PCT Pub. Date: Oct. 3, 2013

(65) Prior Publication Data
US 2015/0042934 A1 Feb. 12, 2015

(30) Foreign Application Priority Data

Mar. 28, 2012 (JP) ................................ 2012-075135

(51) Int. Cl.
*G02F 1/1335* (2006.01)
*G02B 5/02* (2006.01)
(Continued)

(52) U.S. Cl.
CPC .............. *G02B 5/0247* (2013.01); *B32B 3/266* (2013.01); *B32B 27/08* (2013.01); *B32B 27/36* (2013.01);
(Continued)

(58) Field of Classification Search
CPC ........ G02B 5/047; G02B 5/00; G02B 5/0247; G02F 1/133504; G02F 1/133524; G09F 9/00; G03F 7/30; B32B 27/365
USPC ............................................ 349/64, 110, 112
See application file for complete search history.

(56) References Cited

U.S. PATENT DOCUMENTS

2008/0111945 A1* 5/2008 Epstein .................. G02B 5/045
349/62
2009/0284685 A1* 11/2009 Yamaguchi .......... G02B 5/0242
349/64

(Continued)

FOREIGN PATENT DOCUMENTS

JP 2009-086682 A 4/2009

OTHER PUBLICATIONS

Official Communication issued in International Patent Application No. PCT/JP2013/056811, mailed on Apr. 9, 2013.

*Primary Examiner* — Paul Lee
(74) *Attorney, Agent, or Firm* — Keating & Bennett, LLP

(57) ABSTRACT

A viewing angle extending film (a light diffusing member) includes a base material with optical transparency, a plurality of light-shielding layers dotted on one surface of the base material, and a transparent resin layer (optically transparent material layer) provided on the one surface of the base material. At least a light-shielding layer, which is part of the plurality of light-shielding layers, has a planar shape surrounded by a first figure and a second figure contained in the first figure or a planar shape surrounded by at least part of the first figure and at least part of the second figure overlaid with the first figure. Hollow portions are provided in a formation region of the light-shielding layers, each hollow portion being shaped so that a cross-sectional area obtained by cutting along a plane parallel to the one surface of the base material is large on the light-shielding layer side and is gradually decreased as being away from the light-shielding layer. A part other than the hollow portions is taken as a light transmitting portion.

25 Claims, 27 Drawing Sheets

(51) Int. Cl.
*G02B 5/00* (2006.01)
*G09F 9/00* (2006.01)
*G03F 7/30* (2006.01)
*B32B 27/08* (2006.01)
*B32B 27/36* (2006.01)
*B32B 3/26* (2006.01)

(52) U.S. Cl.
CPC ................ *B32B 27/365* (2013.01); *G02B 5/00* (2013.01); *G02B 5/02* (2013.01); *G02B 5/0257* (2013.01); *G02F 1/133504* (2013.01); *G03F 7/30* (2013.01); *G09F 9/00* (2013.01); *B32B 2255/10* (2013.01); *B32B 2255/26* (2013.01); *B32B 2307/412* (2013.01); *B32B 2307/418* (2013.01); *B32B 2307/42* (2013.01); *B32B 2457/20* (2013.01); *B32B 2551/00* (2013.01); *G02F 1/133524* (2013.01); *G02F 2001/133562* (2013.01)

(56) References Cited

U.S. PATENT DOCUMENTS

| | | | |
|---|---|---|---|
| 2009/0296023 A1* | 12/2009 | Lee | G02B 5/0242 349/64 |
| 2010/0110336 A1* | 5/2010 | Lin | G02F 1/133606 349/64 |
| 2011/0032453 A1* | 2/2011 | Moon | G02B 5/0242 349/64 |
| 2011/0234942 A1* | 9/2011 | Nakagome | G02B 5/0226 349/64 |

* cited by examiner

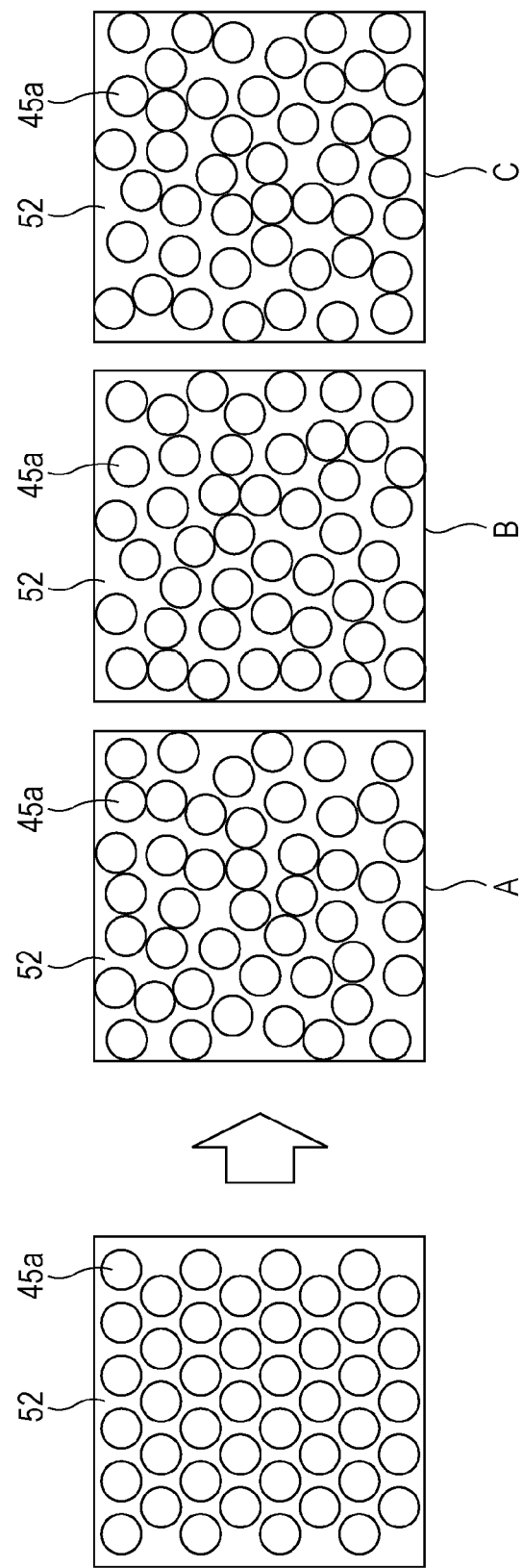

LIGHT DIFFUSING MEMBER COMPRISING HOLLOW PORTIONS AND A PLURALITY OF LIGHT-SHIELDING LAYERS DOTTED ON ONE SURFACE OF A BASE MATERIAL, METHOD FOR MANUFACTURING THE SAME AND DISPLAY DEVICE

TECHNICAL FIELD

The present invention relates to a light diffusing member, a method for manufacturing the same, and a display device.

This application is based upon and claims the benefit of priority of the prior Japanese Patent Application No. 2012-075135, filed in Japan on Mar. 28, 2012, the contents of which are incorporated herein by reference.

BACKGROUND ART

As displays for portable electronic devices including portable telephones and the like or those for television sets, personal computers, and the like, liquid-crystal display devices have been widely used. In general, it is conventionally known that the liquid-crystal display device is excellent in viewability from the front but has a narrow viewing angle. Thus, various contrivances have been made to extend the viewing angle. In one structure, a member for diffusing light emitted from a display body such as a liquid-crystal panel (hereinafter referred to as a light diffusing member) is provided to a visual recognition side of a display body.

For example, PTL 1 discloses a light diffusing sheet with a plurality of frustum-shaped unit lenses two-dimensionally arranged on a plane. In this light diffusing sheet, light passes through the inside of each unit lens, and a gap between adjacent unit lenses is filled with a resin material having light absorptive particles added thereto.

CITATION LIST

Patent Literature

PTL 1: Japanese Unexamined Patent Application Publication No. 2009-86682

SUMMARY OF INVENTION

Technical Problem

In the light diffusing sheet described in PTL 1, to increase the amount of emission light, the entire area of a unit lens part occupying the entire area of the light diffusing sheet, that is, the entire area of light emitting surfaces of the unit lenses, has to be increased. As a technique for increasing the area of the light emission surface, it can be thought that, for example, while the dimensions of each unit lens are decreased, a pitch between unit lenses is narrowed, thereby increasing arrangement density of the unit lenses. Alternatively, if the only purpose is to increase emission light on the front, it can be thought that the dimensions of each unit lens are increased. However, when these techniques are used, the design and arrangement of the unit lenses have to be changed, and its takes enormous time and effort for design change. Moreover, the angular distribution of emission light from the light diffusing sheet depends on the size of the area of the side surface (tilted surface) of a light transmitting portion. In the techniques described above, the area of the side surface is not increased although the area of the light emission surface is increased. Thus, it is difficult to obtain emission light with a desired angular distribution.

The present invention has been made in order to solve the problem described above, and an object of the present invention is to provide a light diffusing member capable of obtaining emission light with a desired angular distribution. Another object of the present invention is to provide a light diffusing member manufacturing method capable of reducing time and effort for design change. Still another object of the present invention is to provide a display device including the light diffusing member described above and excellent in display quality.

Solution to Problem

To achieve the object described above, a light diffusing member of the present invention includes a base material with optical transparency, a plurality of light-shielding layers dotted on one surface of the base material, and an optically transparent material layer provided on the one surface of the base material and thicker than the light-shielding layers, wherein at least a light-shielding layer, which is part of the plurality of light-shielding layers, has a planar shape surrounded by a first figure and a second figure contained in the first figure or a planar shape surrounded by at least part of the first figure and at least part of the second figure arranged so as to be partially overlaid with the first figure, when viewed in a direction of a normal to the one surface of the base material, hollow portions are provided in a formation region of the light-shielding layers, each hollow portion being shaped so that a cross-sectional area obtained by cutting along a plane parallel to the one surface of the base material is large on the light-shielding layer side and is gradually decreased as being away from the light-shielding layer, and a part of the optically transparent material layer other than the hollow portions is taken as a light transmitting portion.

In the light diffusing member of the present invention, the plurality of light-shielding layers are non-cyclically arranged when viewed in the direction of the normal to the one surface of the base material.

In the light diffusing member of the present invention, dimensions of at least one light-shielding layer among the plurality of light-shielding layers are different from dimensions of other light-shielding layers.

A light diffusing member of the present invention includes a base material with optical transparency, a light-shielding layer formed on one surface of the base material, a plurality of openings dotted in a formation region of the light-shielding layer, and an optically transparent material layer provided in the formation region of the plurality of openings and thicker than the light-shielding layer, wherein at least an opening, which is part of the plurality of openings, has a planar shape surrounded by a first figure and a second figure contained in the first figure or a planar shape surrounded by at least part of the first figure and at least part of the second figure arranged so as to be partially overlaid with the first figure, when viewed in a direction of a normal to the one surface of the base material, hollow portions are provided in a formation region of the light-shielding layer, each hollow portion being shaped so that a cross-sectional area obtained by cutting along a plane parallel to the one surface of the base material is large on the light-shielding layer side and is gradually decreased as being away from the light-shielding layer, and a part of the optically transparent material layer other than the hollow portions are taken as a light transmitting portion.

In the light diffusing member of the present invention, the plurality of openings are non-cyclically arranged when viewed in the direction of the normal to the one surface of the base material.

In the light diffusing member of the present invention, dimensions of at least one opening among the plurality of openings are different from dimensions of other openings.

In the light diffusing member of the present invention, the first figure and the second figure have an identical shape.

In the light diffusing member of the present invention, the second figure is concentrically arranged inside the first figure.

In the light diffusing member of the present invention, the second figure is eccentrically arranged inside the first figure.

In the light diffusing member of the present invention, positions of the second figure inside the first figure are irregular over the plurality of first figures.

In the light diffusing member of the present invention, at least one of the first figure and the second figure has an isotropic shape.

In the light diffusing member of the present invention, at least one of the first figure and the second figure has an anisotropic shape.

In the light diffusing member of the present invention, a plurality of said second figures are arranged inside one said first figure.

In the light diffusing member of the present invention, the plurality of second figures arranged inside one said first figure include the second figure in an isotropic shape and the second figure in an anisotropic shape.

In the light diffusing member of the present invention, air is present in the hollow portions.

In the light diffusing member of the present invention, a light scattering layer is provided at a position on a light emission side from the light transmitting portion.

In the light diffusing member of the present invention, the light-shielding layers are made of a light absorptive material.

In the light diffusing member of the present invention, the light absorptive material is configured of any of black resin, black ink, a metal simple substance, and a laminated film of a metal simple substance and a metal oxide.

In the light diffusing member of the present invention, a tilt angle of a side surface of at least one light transmitting portion among a plurality of said light transmitting portions is different from a tilt angle of a side surface of other light transmitting portions.

In the light diffusing member of the present invention, the tilt angle of the side surface of at least one light transmitting portion among the plurality of said light transmitting portions is varied depending on a location.

A light diffusing member manufacturing method of the present invention includes a step of arranging a plurality of first figures in a dotted manner in a predetermined region, a step of arranging a plurality of second figures so that the second figures are contained in the first figures or are partially overlaid with the first figures and designing a plurality of patterns each having a planar shape surrounded by at least part of the first figures and at least part of the second figures, a step of forming a plurality of light-shielding layers corresponding to the patterns on one surface of a base material with optical transparency, a step of forming a negative-type photosensitive resin layer with optical transparency on the one surface of the base material so as to cover the plurality of light-shielding layers, a step of irradiating the negative-type photosensitive resin layer with diffused light from a surface opposite to the one surface of the base material where the light-shielding layers and the negative-type photosensitive resin layer are formed, through the base material in a non-formation region of the light-shielding layers, and a step of developing the negative-type photosensitive resin layer irradiated with the diffused light and forming hollow portions in a formation region of the light-shielding layers in the negative-type photosensitive resin layer, each hollow portion being shaped so that a cross-sectional area obtained by cutting along a plane parallel to the one surface of the base material is large on the light-shielding layer side and is gradually decreased as being away from the light-shielding layer.

A light diffusing member manufacturing method of the present invention includes a step of arranging a plurality of first figures in a dotted manner in a predetermined region, a step of arranging a plurality of second figures so that the second figures are contained in the first figures or are partially overlaid with the first figures and designing a plurality of patterns each having a planar shape surrounded by at least part of the first figures and at least part of the second figures, a step of forming a plurality of light-shielding layers with a plurality of openings corresponding to the patterns on one surface of a base material with optical transparency, a step of forming a negative-type photosensitive resin layer with optical transparency on the one surface of the base material so as to cover the plurality of openings, a step of irradiating the negative-type photosensitive resin layer with diffused light from a surface opposite to the one surface of the base material where the light-shielding layers and the negative-type photosensitive resin layer are formed, through the base material of the openings, and a step of developing the negative-type photosensitive resin layer irradiated with the diffused light and forming hollow portions in a formation region of the light-shielding layers in the negative-type photosensitive resin layer, each hollow portion being shaped so that a cross-sectional area obtained by cutting along a plane parallel to the one surface of the base material is large on the light-shielding layer side and is gradually decreased as being away from the light-shielding layer.

A display device of the present invention includes a display body, and a viewing angle extending member provided on a visual recognition side of the display body, the member emitting light, with an angular distribution of light caused to enter from the display body being extended more than an angular distribution before the entrance of the light, wherein the viewing angle extending member is configured of the light scattering member of the present invention.

In the display device of the present invention, the display body has a light source and a light modulating element which modulates light from the light source, and the light source emits light with directivity.

In the display device of the present invention, the display body is a liquid-crystal display element.

Advantageous Effects of Invention

According to the present invention, a light diffusing member capable of obtaining emission light with a desired angular distribution can be provided. Also, according to the present invention, a light diffusing member manufacturing method capable of reducing time and effort for design change can be provided. Furthermore, according to the present invention, a display device including the light diffusing member described above and excellent in display quality can be provided.

BRIEF DESCRIPTION OF DRAWINGS

FIG. 9B is a diagram depicting an arrangement of the light-shielding portion of the viewing angle extending film of the first modification example.

DESCRIPTION OF EMBODIMENTS

First Embodiment

A first embodiment of the present invention is described below by using FIG. 1 to FIG. 7B.

In the present embodiment, a liquid-crystal display device including a transmission-type liquid-crystal panel is exemplarily described as a display body.

Note that in all drawings described below, for ease of viewing, each component may be depicted by varying the scale of dimensions.

Figure 1:
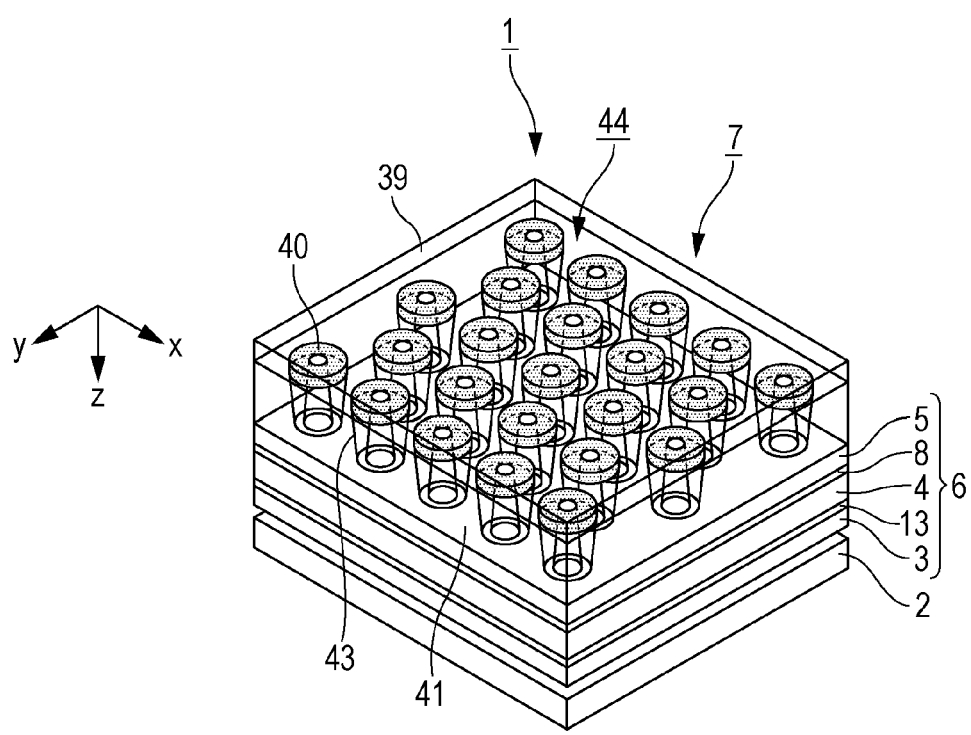
FIG. 1 is a perspective view depicting a liquid-crystal display device of a first embodiment.
Figure 2A:
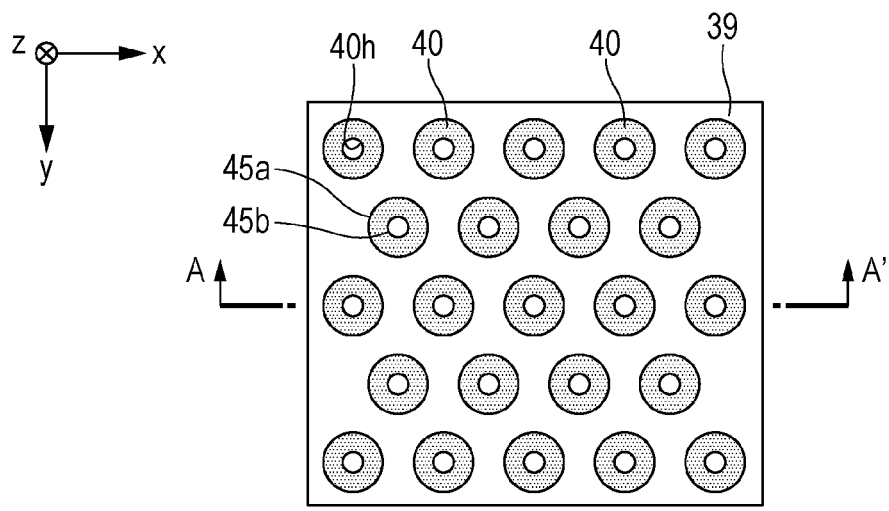
FIG. 2A is a plan view of a liquid-crystal display device of the first embodiment.

FIG. 1 is a perspective view of a liquid-crystal display device of the present embodiment when viewed from diagonally above (on a visual recognition side). FIG. 2A is a plan view of the liquid-crystal display device of the present embodiment, and FIG. 2B is a sectional view along an A-A' line of FIG. 2A.

Figure 2B:
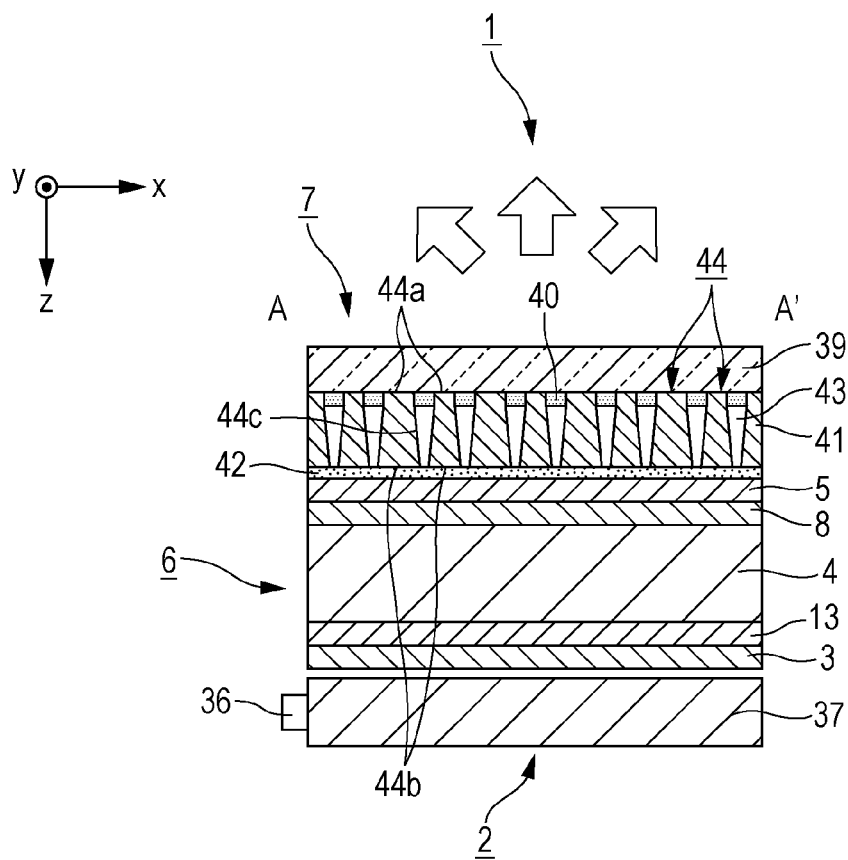
FIG. 2B is a sectional view along an A-A' line of FIG. 2A.

A liquid-crystal display device 1 (display device) of the present embodiment is configured of, as depicted in FIG. 1 and FIG. 2B, a liquid-crystal display body 6 having a backlight 2 (light source), a first polarizing plate 3, a first phase difference plate 13, a liquid-crystal panel 4 (light modulating element), a second phase difference plate 8, and a second polarizing plate 5; and a viewing angle extending film 7 (viewing angle extending member, light diffusing member). While the liquid-crystal panel 4 is schematically depicted as being shaped as one plate in FIG. 1 and FIG. 2B, its detailed structure will be described further below by using FIG. 3. An observer views a display from an upper side of the liquid-crystal display device 1 in FIG. 2B where the viewing angle extending film 7 is arranged. Therefore, in the following description, a side where the viewing angle extending film 7 is arranged is referred to as a visual recognition side, and a side where the backlight 2 is arranged is referred to as a back surface side.

In the liquid-crystal display device 1 of the present embodiment, light emitted from the backlight 2 is modulated by the liquid-crystal panel 4, and a predetermined image, character, and so on are displayed with the modulated light. Also, when the light emitted from the liquid-crystal panel 4 passes through the viewing angle extending film 7, the angular distribution of the emission light becomes wider than that before the light enters the viewing angle extending film 7 and, in this state, the light is emitted from the viewing angle extending film 7. With this, the observer can visually recognize the display with a wide viewing angle.

A specific structure of the liquid-crystal panel 4 is described below.

Here, an active-matrix transmission-type liquid-crystal panel is exemplarily described. However, a liquid-crystal panel applicable to the present invention is not restricted to an active-matrix transmission-type liquid-crystal panel. The liquid-crystal panel applicable to the present invention may be, for example, a translucent-type (dual-purpose transmission/reflection type) liquid-crystal panel or a reflection-type liquid-crystal panel and, furthermore, may be a simple-matrix liquid-crystal panel in which each picture element does not include a thin-film transistor (hereinafter abbreviated as TFT) for switching.

Figure 3:
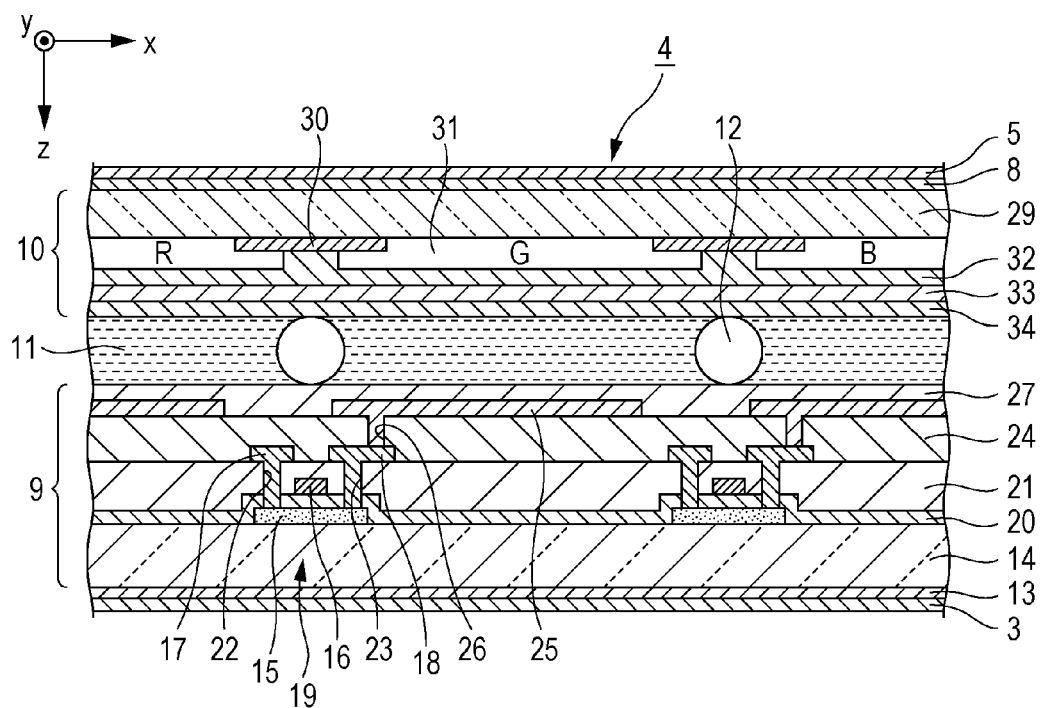
FIG. 3 is a sectional view depicting of a liquid-crystal panel in the liquid-crystal display device.

FIG. 3 is a longitudinal sectional view of the liquid-crystal panel 4.

The liquid-crystal panel 4 has, as depicted in FIG. 3, a TFT substrate 9 as a switching element substrate, a color filter substrate 10 arranged to face the TFT substrate 9, and a liquid-crystal layer 11 interposed between the TFT substrate 9 and the color filter substrate 10. The liquid-crystal layer 11 is enclosed in a space surrounded by the TFT substrate 9, the color filter substrate 10, and a frame-shaped sealing member (not depicted in the drawing) to bond the TFT substrate 9 and the color filter substrate 10 together at predetermined spacing. The liquid-crystal panel 4 of the present embodiment displays in, for example, vertical alignment (VA) mode, and a vertically-aligned liquid crystal with negative dielectric anisotropy is used as the liquid-crystal layer 11. Between the TFT substrate 9 and the color filter substrate 10, globular spacers 12 are arranged to keep the spacing between these substrates constant. Note that the display mode is not restricted to the above-described VA mode, and twisted nematic (TN) mode, super twisted nematic (STN) mode, in-plane switching (IPS) mode, or the like can be used.

On the TFT substrate 9, a plurality of picture elements, which are minimum unit regions for display (not depicted in the drawing), are arranged in a matrix. On the TFT substrate 9, a plurality of source bus lines (not depicted in the drawing) are formed so as to extend in parallel to each other, and also a plurality of gate bus lines (not depicted in the drawing) are formed so as to extend in parallel to each other and be orthogonal to the plurality of source bus lines. Therefore, on the TFT substrate 9, the plurality of source bus lines and the plurality of gate bus lines are formed in a lattice, and a rectangular region sectioned by adjacent source bus lines and adjacent gate bus lines serves as one picture element. The source bus lines are connected to a source electrode of a TFT, which will be described further below, and the gate bus lines are connected to a gate electrode of the TFT.

On a surface on a liquid-crystal layer 11 side of a transparent substrate 14 forming the TFT substrate 9, a TFT 19 is formed, which has a semiconductor layer 15, a gate electrode 16, a source electrode 17, a drain electrode 18, and so on. For the transparent substrate 14, a glass substrate can be used, for example. On the transparent substrate 14, a semiconductor layer 15 is formed, which is made of a semiconductor material such as, for example, continuous gain silicon (CGS), low-temperature poly-silicon (LPS), or amorphous silicon ($\alpha$-Si). Also, a gate insulating film 20 is formed on the transparent substrate 14 so as to cover the semiconductor layer 15. As a material of the gate insulating film 20, a silicon oxide film, a silicon nitride film, a laminated film of these films, or the like is used, for example.

On the gate insulating film 20, a gate electrode 16 is formed so as to face the semiconductor layer 15. As a material of the gate electrode 16, a multilayered film of tungsten (W)/tantalum nitride (TaN), molybdenum (Mo), titanium (Ti), aluminum (Al), or the like is used, for example.

A first interlayer insulating film 21 is formed on the gate insulating film 20 so as to cover the gate electrode 16. As a material of the first interlayer insulating film 21, a silicon oxide film, a silicon nitride film, a laminated film of these films, or the like is used, for example. On the first interlayer insulating film 21, a source electrode 17 and a drain electrode 18 are formed. The source electrode 17 is connected to a source region of the semiconductor layer 15 via a contact hole 22 penetrating through the first interlayer insulating film 21 and the gate insulating film 20. Similarly, the drain electrode 18 is connected to a drain region of the semiconductor layer 15 via a contact hole 23 penetrating through the first interlayer insulating film 21 and the gate insulating film 20. As a material of the source electrode 17 and the drain electrode 18, a conductive material similar to that of the gate electrode 16 described above is used. On the first interlayer insulating film 21, a second interlayer insulating film 24 is formed so as to cover the source electrode 17 and the drain electrode 18. As a material of the second interlayer insulating film 24, a material similar to that of the first interlayer insulating film 21 described above or an organic insulating material is used.

A picture element electrode 25 is formed on the second interlayer insulating film 24. The picture element electrode 25 is connected to the drain electrode 18 via a contact hole 26 penetrating through the second interlayer insulating film 24. Thus, the picture element electrode 25 is connected to the drain region of the semiconductor layer 15, with the drain electrode 18 as a relay electrode. As a material of the picture element electrode 25, a transparent conductive material is used, such as indium tin oxide (ITO) or indium zinc oxide (IZO), for example. With this structure, when a scanning signal is supplied through the gate bus line to turn the TFT 19 to an ON state, an image signal supplied to the source electrode 17 via the source bus line is supplied to the picture element electrode 25 via the semiconductor layer 15 and the drain electrode 18. Also, an alignment film 27 is formed on an entire surface of the second interlayer insulating film 24 so as to cover the picture element electrode 25. This alignment film 27 has an alignment regulating force of causing liquid-crystal molecules forming the liquid-crystal layer 11 to be vertically oriented. Note that as a form of the TFT, a top-gate-type TFT depicted in FIG. 3 or a bottom-gate-type TFT may be used.

On the other hand, on a surface on a liquid-crystal layer 11 side of the transparent substrate 29 forming the color filter substrate 10, a black matrix 30, color filters 31, a planarizing layer 32, a counter electrode 33, and an alignment film 34 are sequentially formed. The black matrix 30 has a function of interrupting transmission of light in a region between picture elements, and is formed of a metal such as chromium (Cr) or a Cr/Cr oxide multilayered film, or a photoresist having carbon particles dispersed in a photosensitive resin. The color filters 31 include coloring matters of red (R), green (G), and blue (B). Any one of R, G, and B color filters 31 is arranged so as to face one picture element electrode 25 on the TFT substrate 9. The planarizing layer 32 is configured of an insulating film which covers the black matrix 30 and the color filters 31, and has a function of mitigating and planarizing steps formed by the black matrix 30 and the color filters 31. On the planarizing layer 32, the counter electrode 33 is formed. As a material of the counter electrode 33, a transparent conductive material similar to that of the picture element electrode 25 is used. Also, the alignment film 34 having a vertical alignment regulating force is formed on the entire surface of the counter electrode 33. The color filters 31 may be configured in a multicolor manner of R, G, and B, and more.

As depicted in FIG. 2B, the backlight 2 has a light source 36 such as a light-emitting diode or a cold-cathode tube and a light-guiding plate 37 which allows light emitted from the light source 36 to be emitted toward the liquid-crystal panel 4 by using internal reflection. The backlight 2 may be of an edge light type as depicted, with the light source 36 arranged at an end face of the light guiding body 37 and, alternatively, may be of a directly-under type with the light source directly under the light guiding body. As the backlight 2 for use in the present embodiment, a backlight with directivity provided by controlling a light emitting direction, that is, a so-called directional backlight, is preferably used. The directional backlight causes collimated or substantially collimated light to enter a light diffusing portion of the viewing angle extending film 7, which will be described further below. By using the directional backlight, blurring is reduced, and light use efficiency can be further increased. The directional backlight described above can be achieved by optimizing the shape, arrangement, and the like of reflective patterns formed in the light guiding plate 37.

Between the backlight 2 and the liquid-crystal panel 4, the first polarizing plate 3 which functions as a polarizer is provided. Between the liquid-crystal panel 4 and the viewing angle extending film 7, the second polarizing plate 5 which functions as an analyzer is provided. The first phase difference plate 13 and the second phase difference plate 8 each for compensating for an optical phase difference are provided between the first polarizing plate 3 and the liquid-crystal panel 4 and between the second polarizing plate 5 and the liquid-crystal panel 4, respectively.

The viewing angle extending film 7 is described in detail below.

The viewing angle extending film 7 is configured of, as depicted in FIG. 1 and FIG. 2B, a base material 39, a plurality of light-shielding layers 40 formed on one surface (a surface opposite to the visual recognition side) of the base material 39, and a transparent resin layer 41 (optically transparent material layer) formed on one surface of the base material 39. As depicted in FIG. 2B, this viewing angle extending film 7 is fixed onto the second polarizing plate 5 by an adhesive layer 42, with a side provided with the transparent resin layer 41 oriented to the second polarizing plate 5 and the side of the base material 39 oriented to the visual recognition side.

For the base material 39, for example, a transparent-resin-made base material is preferably used, such as polyethylene terephthalate (PET), triacetyl cellulose (TAC) film, polycarbonate (PC), polyethylene naphthalate (PEN), polyether sulfone (PES) film, and so on. The base material 39 serves as a ground when the materials of the light-shielding layers 40 and the transparent resin layer 41 are applied later in a manufacturing process, which will be described further below, and has to include heat resistance and mechanical strength in a heat treatment process in the manufacturing process. Therefore, for the base material 39, not only a resin-made base material but also a glass-made base material or the like may be used. However, the thickness of the base material 39 is preferably thinner to a degree of not impairing heat resistance and mechanical strength. The reason for this is that display blurring can occur as the thickness of the base material 39 is thicker. Also, the base material 39 preferably has a total light transmittance of 90% or more in the specification of JIS K7361-1. When the total light transmittance is 90% or more, sufficient transparency can be obtained. In the present embodiment, by way of example, a transparent-resin-made base material having a thickness of 100 µm is used.

The plurality of light-shielding layers 40 are formed, as depicted in FIG. 2A, so as to be dotted over one surface (a surface opposite to the visual recognition side) of the base material 39. In the present embodiment, each of the light-shielding layers 40 has a planar shape, when viewed in the direction of the normal to the base material 39, in which a circle 45a as a first figure contains a circle 45b as a second figure smaller than the first figure. In the following, the circle 45a is referred to as a first circle, and the circle 45b is referred to as a second circle. The light-shielding layer 40 is an annular part surrounded by the first circle 45a and the second circle 45b. The inside of the second circle 45b is an opening 40h of the light-shielding layer 40.

In the case of the present embodiment, the center of the first circle 45a and the center of the second circle 45b coincide with each other. That is, the opening 40h is concentrically arranged inside the light-shielding layer 40.

The plurality of light-shielding layers 40 are regularly arranged. Here, an x axis is defined as a horizontal direction of a screen of the liquid-crystal panel 4, a y axis is defined as a vertical direction of the screen of the liquid-crystal panel 4, and a z axis is defined as a thickness direction of the liquid-crystal display device 1. Among the plurality of light-shielding layers 40, for example, light-shielding layers 40 on each column aligned in a y axis direction are arranged at a predetermined pitch, and light-shielding layers 40 on each row aligned in an x axis direction are arranged at a predetermined pitch. Also, light-shielding layers 40 on a predetermined row aligned in the x axis direction and light-shielding layers 40 on a row adjacent to that row in the y axis direction are arranged at positions each shifted by a ½ pitch in the x axis direction.

The light-shielding layers 40 are configured of, by way of example, black resin layers with light absorbency and photosensitivity such as black resists, or black ink. In addition, a metal simple substance such as chromium (Cr) or a Cr/Cr oxide multilayered film or a laminated film of a metal simple substance and a metal oxide may be used. In the present embodiment, by way of example, each light-shielding layer 40 has a diameter of 10 μm, and a pitch between adjacent light-shielding layers 40 is 20 μm.

The transparent resin layer 41 is formed on one surface of the base material 39. The transparent resin layer 41 is configured of an organic material with optical transparency and photosensitivity such as acrylic resin or epoxy resin.

Also, the transparent resin layer 41 preferably has a total light transmittance of 90% or more in the specification of JIS K7361-1. When the total light transmittance is 90% or more, sufficient transparency can be obtained. The layer thickness of the transparent resin layer 41 is set to be sufficiently larger than the thickness of the light-shielding layer 40. In the case of present embodiment, the layer thickness of the transparent resin layer 41 is, by way of example, on the order of 25 μm, and the layer thickness of the light-shielding layer 40 is, by way of example, on the order of 1 μm.

In a formation region of the light-shielding layers 40 in the transparent resin layer 41, hollow portions 43 each is shaped so that a cross-sectional area obtained by cutting along a plane parallel to the one surface of the base material 39 is large on a light-shielding layer 40 side and is gradually decreased as being away from the light-shielding layer 40. That is, the cross-sectional shape of the hollow portion 43 has an inverted triangular shape when the base material 39 is on an upper side. In the case of the present embodiment, since the planar shape of the light-shielding layer 40 is an annular shape, the planar shape of the hollow portion 43 is also an annular shape.

Air is present inside the hollow portions 43. A part other than the hollow portions 43 of the transparent resin layer 41, that is, a part where the transparent resin is continuously present, contributes to light transmission. The transparent resin in a frustum shape is present also in a part corresponding to the openings 40h of the light-shielding layers 40, contributing to light transmission. Therefore, in the following description, a part other than the hollow portions 43 in the transparent resin layer 41 is referred to as a light transmitting portion 44. Light entering the light transmitting portion 44 is totally reflected from a side surface of the light transmitting portion 44, that is, an interface between the light transmitting portion 44 and the hollow portion 43, is guided toward the base material 39 as being substantially confined inside the light transmitting portion 44, and is then emitted outside via the base material 39.

The viewing angle extending film 7 is arranged so that the base material 39 is oriented to the visual recognition side as depicted in FIG. 2B. Therefore, of two facing surfaces of the light transmitting portion 44, a surface with a smaller area (a surface on a side in contact with the base material 39) is a light emission end face 44a, and a surface with a larger area (a surface opposite to the base material 39) is a light incident end face 44b. A tilt angle θ of a side surface 44c (an interface between the light transmitting portion 44 and the hollow portion 43) of the light transmitting portion 44 (an angle formed by the light emission end face 44a and the side surface 44c depicted in FIG. 4B) is preferably on the order of 60° to 90°. However, the tilt angle θ of the side surface 44c of the light transmitting portion 44 is not particularly restrictive as long as loss of incident light is not so large and the angle allows incident light to be sufficiently diffused.

Figure 4A:
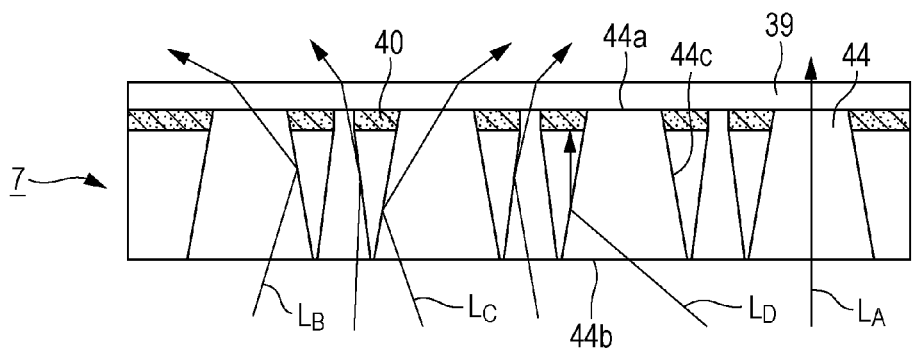
FIG. 4A is a diagram for describing the state of reflection of light on a side surface of a light transmitting portion of a viewing angle extending film in the liquid-crystal display device.
Figure 4B:
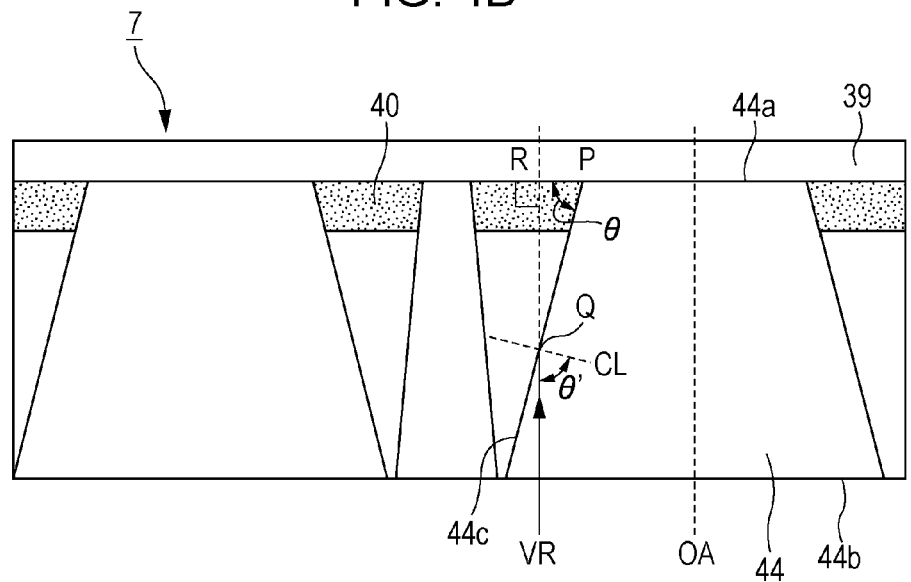
FIG. 4B is a diagram for describing the state of reflection of light on the side surface of the light transmitting portion of the viewing angle extending film in the liquid-crystal display device.

As depicted in FIG. 4B, the angle θ formed by the side surface 44c of the light transmitting portion 44 and the light emission end face 44a is set at an angle θ' (in units of degrees) exceeding a critical angle with respect to a normal line CL of the side surface 44c of the light transmitting portion 44 so as to totally reflect light entering in parallel to or substantially in parallel to an optical axis OA. In the following, the angle θ may refer to as a tilt angle of the side surface 44c of the light transmitting portion 44. The angle θ can be represented by an angle QPR, when a point at which the side surface 44c of the light transmitting portion 44 crosses the light emission end face 44a is a point P, an incident point of incident light VR parallel to the optical axis OA to the side surface 44c is a point Q, and a point of intersection of a perpendicular line of perpendicular lines with respect to the light emission end face 44a that passes through the point Q and the light emission end face 44a is a point R. Here, since an angle PQR has a value of (90-θ)°, the tilt angle θ of the side surface 44c of the light transmitting portion 44 is equal to the incident angle θ' of the incident light VR at the point Q. Therefore, the tilt angle θ of the side surface 44c of the light transmitting portion 44 is set at an angle exceeding the critical angle described above.

In the case of the present embodiment, since air is present in the hollow portions 43, if the light transmitting portion 44 is formed of, for example, transparent acrylic resin, the side surface 44c of the light transmitting portion 44 serves as an interface between the transparent acrylic resin and air. Here, even if the hollow portions 43 are filled with another low-refractive-index material, a refractive index difference in the interface between inside and outside of the light transmitting portion 44 is maximum when air is present, compared with the case where any low-refractive-index material is present outside. Therefore, according to the Snell's law, the critical angle is minimized and an incident angle range in which light is totally reflected from the side surface 44c of the light transmitting portion 44 is extended most in the structure of the present embodiment. As a result, optical loss can be further suppressed, and high luminance can be obtained.

As indicated by arrows $L_B$ and $L_C$ of FIG. 4A, incident light entering at an angle exceeding the critical angle is totally reflected from the side surface 44c, passes through the light transmitting portion 44, and is then emitted to an observer side. Also, as indicated by an arrow $L_A$ of FIG. 4A, incident light passing through the light transmitting portion 44 without entering the side surface 44c is directly emitted to the observer side. On the other hand, as indicated by an arrow $L_D$ of FIG. 4A, incident light entering at an angle below the critical angle is not totally reflected, passes through the side surface 44c of the light transmitting portion 44, and then enters the hollow portion 43.

In the case of the present embodiment, since the light-shielding layer 40 with light absorbency is provided in a region other than the light transmitting portion 44, light passing through the side surface 44c of the light transmitting portion 44 is absorbed in the light-shielding layers 40. Therefore, display blurring and a decrease in contrast are suppressed. However, when light passing through the side surface 44c of the light transmitting portion 44 increases, loss in the light amount occurs, and an image with high luminance cannot be obtained. Thus, in the liquid-crystal display device 1 of the present embodiment, a backlight for emitting light at an angle which prevents light from entering the side surface 44c of the light transmitting portion 44 at an angle below the critical angle, that is, a so-called directional backlight, is preferably used.

The refractive index of the base material 39 and the refractive index of the transparent resin layer 41 are desirably substantially equal to each other. The reason for this is that if, for example, the refractive index of the base material 39 and the refractive index of the transparent resin layer 41 greatly differ, unwanted light refraction and reflection occur at an interface between the transparent resin layer 41 and the base material 39 when light entering from the light incident end face 44b is emitted from the transparent resin layer 41, thereby possibly causing inconveniences such that a desired viewing angle cannot be obtained and the light amount of emission light is decreased.

Figure 5:
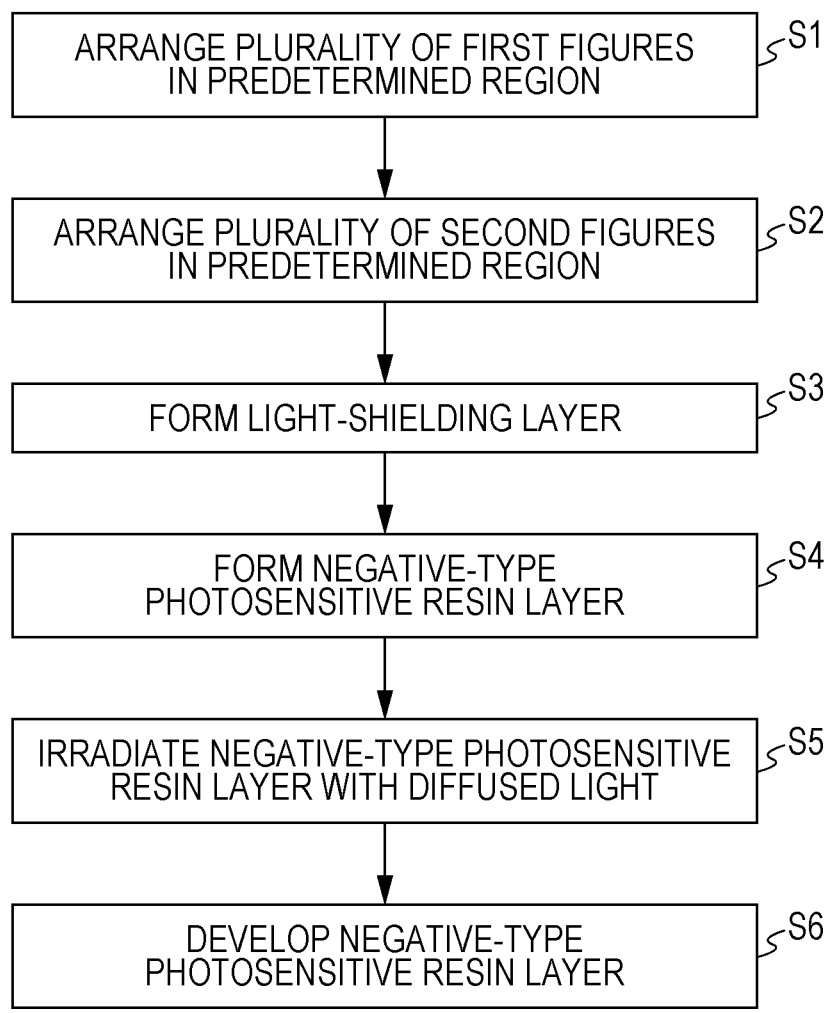
FIG. 5 is a flowchart depicting a viewing angle extending film manufacturing process.
Figure 6A:
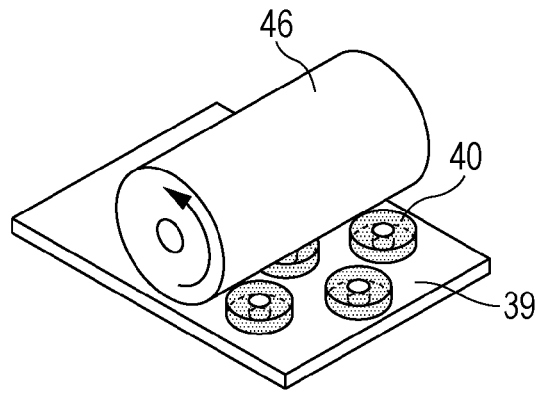
FIG. 6A is a diagram depicting the viewing angle extending film manufacturing process.
Figure 6B:
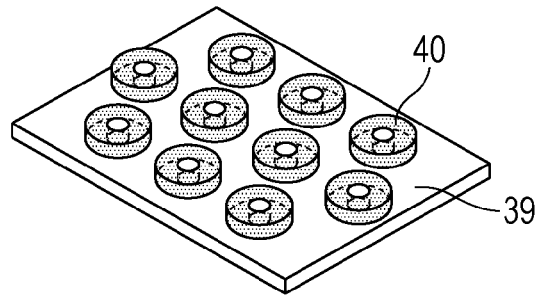
FIG. 6B is a diagram depicting the viewing angle extending film manufacturing process.
Figure 6C:
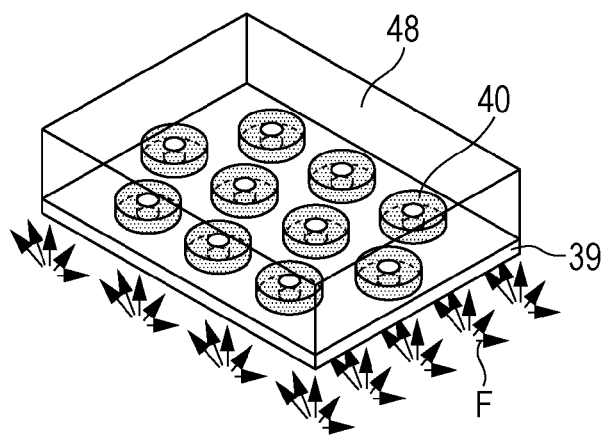
FIG. 6C is a diagram depicting the viewing angle extending film manufacturing process.
Figure 6D:
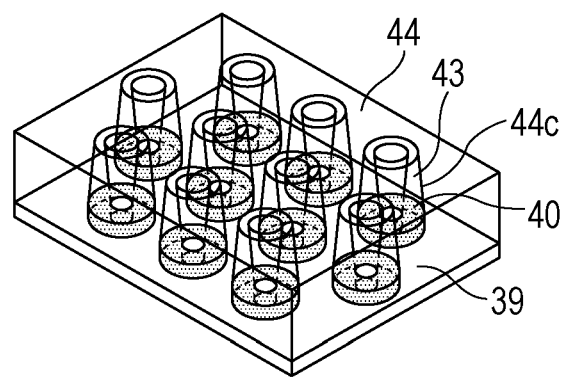
FIG. 6D is a diagram depicting the viewing angle extending film manufacturing process.

Next, a method of manufacturing the above-structured liquid-crystal display device 1 is described by using FIG. 5 to FIG. 6D.

In the following, a process of manufacturing the viewing angle extending film 7 is mainly described.

A general outline of the process of manufacturing the liquid-crystal display body 6 is first described. Initially, the TFT substrate 9 and the color filter substrate 10 are respectively fabricated. Then, a surface of the TFT substrate 9 where the TFT 19 is formed and a surface of the color filter substrate 10 where the color filters 31 are formed are arranged so as to face each other, and the TFT substrate 9 and the color filter substrate 10 are bonded together via the sealing member. Then, liquid crystal is injected into a space surrounded by the TFT substrate 9, the color filter substrate 10, and the sealing member. Then, the first phase difference plate 13, the first polarizing plate 3, the second phase difference plate 8, and the second polarizing plate 4 are each bonded on both sides of the thus-fabricated liquid-crystal panel 4 by using an optical adhesive or the like. Through the above-described processes, the liquid-crystal display body 6 is completed.

Note that a conventionally known method is used for a method of manufacturing the TFT substrate 9 and the color filter substrate 10 and is therefore not described herein.

In manufacturing the viewing angle extending film 7, patterns of the light-shielding layers 40 are designed. Here, as a first stage of pattern designing, a plurality of first figures are arranged so as to be dotted in a predetermined region (step S1 of FIG. 5). In the case of the present embodiment, as the plurality of first figures, the first circles 45*a* of the same dimensions are used. In a rectangular region equal in dimension to the base material 39, as depicted in FIG. 2A, the plurality of first circles 45*a* are arranged at a predetermined pitch on each column aligned in the y axis direction and at a predetermined pitch each row aligned in the x axis direction. Furthermore, the plurality of first circles 45*a* are arranged on a predetermined row aligned in the x axis direction and on a row adjacent to that row in the y axis direction are arranged at positions each shifted by a ½ pitch in the x axis direction.

Next, as a second stage, a plurality of second figures are arranged so as to be contained in the first figures (step S2 of FIG. 5). In the case of the present embodiment, as the plurality of second figures, the second circles 45*b* having a diameter smaller than that of the first circles 45*a* are used, and each second circle 45*b* is concentrically arranged inside the first circle 45*a*. With this, a plurality of annular-shaped patterns each surrounded by the first circle 45*a* and the second circle 45*b* are designed.

Here, a ratio of the entire area of the light emission end face 44*a* of the light transmitting portion 44 with respect to the entire area of the viewing angle extending film 7 (base material 39) is defined as an aperture ratio. For example, when the viewing angle extending film 7 with an aperture ratio of 60% is manufactured, in a first stage, the number and dimensions of the first circles 45*a* are set so that, for example, the aperture ratio is 50% on the assumption that all of the inside of the first circles 45*a* are light-shielding layers. Next, in a second stage, with an area with an aperture ratio of 10% assigned to all of the first circles 45*a*, the dimensions of the second circles 45*b* are set. As such, by arranging each second circle 45*b* serving as the opening 40*h* of the light-shielding layer 40 inside the first circle 45*a*, 50%, which is the aperture ratio when all of the inside of the first circles 45*a* are assumed to be light-shielding layers, can be increased to 60%.

Next, based on the patterns designed in the previous process, the light-shielding layers 40 are formed on the base material 39 (step S3 of FIG. 5).

As depicted in FIG. 6A, the base material 39 of polyethylene terephthalate (PET) having a thickness of 100 μm is prepared and, on one surface of the base material 39, the light-shielding layer 40 having a thickness of 1 μm and made of black resin or black ink containing carbon as a light-shielding layer material is transferred from a roller 46 onto the base material 39 by using a print process.

With this process, as depicted in FIG. 6B, the plurality of light-shielding layers 40 each having an annular planar shape are formed on one surface of the base material 39. The annular-shaped light-shielding layers 40 correspond to a non-formation region (hollow portions 43) of the light transmitting portion 44 at the next process. While the light-shielding layers 40 are formed by the print process using black resin or black ink in the present embodiment, in place of this method, the light-shielding layers 40 may be formed by photolithography using a black negative resist. Alternatively, the light-shielding layers 40 may be directly formed on the base material 39 by mask vapor deposition of metal such as chromium.

Next, as depicted in FIG. 6C, upper surfaces of the light-shielding layers 40 are coated with a transparent negative resist (a negative-type photosensitive resin layer) made of acrylic resin as an optically transparent material using a spin coat method, thereby forming a coating film 48 having a film thickness of 25 μm (step S4 of FIG. 5).

Next, the base material 39 having the above-described coating film 48 formed thereon is placed on a hot plate for prebake of the coating film 48 at a temperature of 95° C. With this, a solvent in the transparent negative resist is volatilized.

Next, with the light-shielding layers 40 as a mask, the coating film 48 is irradiated with diffused light F from a base material 39 side for exposure (step S5 of FIG. 5). Here, an exposure device using mixed rays of an i ray having a wavelength of 365 nm, an h ray having a wavelength of 404 nm, and a g ray having a wavelength of 436 nm is used. The exposure amount is assumed to be 500 mJ/cm$^2$. Here, as means for irradiating the base material 39 with parallel rays emitted from the exposure device as the diffused light F, for example, a diffusing plate having a haze on the order of 50 is arranged on an optical path of light emitted from the exposure device, and light irradiation is performed via the diffusing plate.

Then, the base material 39 having the above-described coating film 48 formed thereon is placed on the hot plate for post exposure bake (PEB) of the coating film 48 at a temperature of 95° C.

Next, the coating film 48 made of the transparent negative resist is developed by using a dedicated developing solution, and postbake is performed at 100° C. (step S6 of FIG. 5). With this, as depicted in FIG. 6D, the transparent resin layer 41 having the plurality of hollow portions 43 is formed on one surface of the base material 39. In the present embodiment, since exposure is performed by using the diffused light F as depicted in FIG. 6C, the transparent negative resist forming the coating film 48 is radially exposed so as to spread outside from the non-formation region of the light-shielding layers 40. With this, the hollow portions 43 each in a forward tapered shape are formed, and the light transmitting portion 44 is shaped in an inverted tapered shape. The tilt angle of the side surface 44*c* of the light transmitting portion 44 can be controlled by the degree of diffusion of the diffused light F. In the case of the present embodiment, as described above, the degree of diffusion of the diffused light F is desirably set so that the tilt angle of the side surface 44c of the light transmitting portion 44 is, for example, on the order of 60° to 90°.

Thus, the viewing angle extending film 7 of the present embodiment is completed through the processes in FIG. 6A to FIG. 6D. The total light transmittance of the viewing angle extending film 7 is preferably 90% or higher. When the total light transmittance is 90% or higher, sufficient transparency can be obtained, and optical performance desired for the viewing angle extending film 7 can be sufficiently achieved. The total light transmittance is according to the specification in JIS K7361-1. Note that while an example of using a liquid-type resist as a material of the transparent resin layer is described in the present embodiment, a film-type resist may be used in place of this structure.

Finally, as depicted in FIG. 2B, the completed viewing angle extending film 7 is affixed to the liquid-crystal display body 6 via the adhesive layer 42, with the base material 39 oriented to the visual recognition side and the light transmitting portion 44 facing the second polarizing plate 5.

With the processes described above, the liquid-crystal display device 1 of the present embodiment is completed.

Figure 7A:
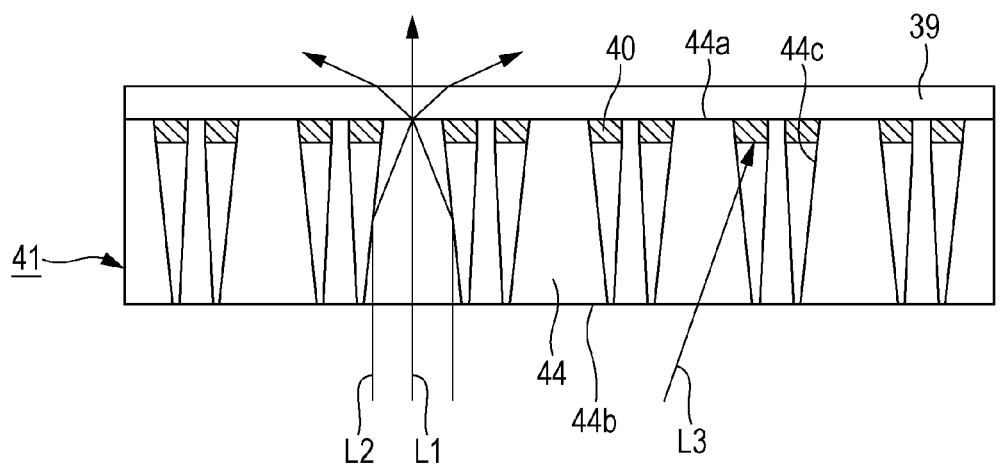
FIG. 7A is a schematic diagram for describing an operation of the viewing angle extending film.
Figure 7B:
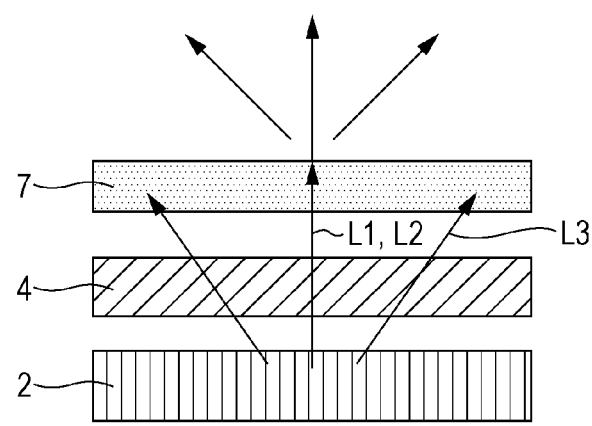
FIG. 7B is a schematic diagram for describing an operation of the viewing angle extending film.

A viewing angle extending effect of the viewing angle extending film 7 of the present embodiment is described by using FIG. 7A and FIG. 7B.

As depicted in FIG. 7A, of the light emitted from the liquid-crystal display body 6 and entering the viewing angle extending film 7, light L1 substantially perpendicularly entering the light incident end face 44b near the center of the light transmitting portion 44 is not totally reflected from the side surface 44c of the light transmitting portion 44, and directly travels and passes rectilinearly through the light transmitting portion 44. Also, light L2 substantially perpendicularly entering the light incident end face 44b on a peripheral portion of the light transmitting portion 44 enters the side surface 44c of the light transmitting portion at an incident angle larger than the critical angle, and is therefore totally reflected from the side surface 44c of the light transmitting portion 44. The totally reflected light is further refracted on the light emission end face 44a of the light transmitting portion 44, and is emitted in a direction forming a large angle with respect to the direction of the normal to the light emission end face 44a. On the other hand, light L3 diagonally entering the light incident end face 44b of the light transmitting portion 44 enters the side surface 44c of the light transmitting portion 44 at an incident angle smaller than the critical angle. Thus, the light L3 passes through the side surface 44c of the light transmitting portion 44 to be absorbed in the light-shielding layer 40.

From the operation described above, as depicted in FIG. 7B, the lights L1 and L2 substantially perpendicularly entering the viewing angle extending film 7 are emitted from the viewing angle extending film 7, with the angular distribution spreading more than that before the lights entering the viewing angle extending film 7. Therefore, even if the observer tilts a line of sight from a front direction (the direction of the normal) of the liquid-crystal display body 6, a favorable display can be visually recognized. In particular, in the case of the present embodiment, since the planar shape of the side surface 44c (reflection surface) of the light transmitting portion 44 is a circular shape, the angular distribution spreads in all directions centering on the direction of the normal to a screen of the liquid-crystal display body 6. Therefore, the observer can visually recognize a favorably display in all directions. That is, with the use of this viewing angle extending film 7, the viewing angle of the liquid-crystal display body 6 can be extended. On the other hand, the light L3 diagonally entering the viewing angle extending film 7 is light diagonally passing through the liquid-crystal panel 4, and is light different from that with desired retardation, that is, so-called light as a factor in decreasing display contrast.

The viewing angle extending film 7 of the present embodiment can increase display contrast by cutting the above-described light by the light-shielding layers 40.

In a conventional light diffusing sheet, when the once set aperture ratio is desired to be changed, the dimensions of each light transmitting portion (or light-shielding layer) and the number thereof have to be redesigned in order to change the area of the light transmitting portion (or light-shielding layers) occupying the entire sheet. Thus, it takes enormous time and effort for design change. Moreover, while the angular distribution of emission light from a light diffusing sheet depends on the size of the area of the side surface (tilted surface) of the light transmitting part, when the dimensions of each light transmitting portion and the number thereof are changed, the area of the side surface is not increased although the area of the light emission surface is increased. Thus, there is a problem in which it is difficult to obtain emission light with a desired angular distribution.

By contrast, in the viewing angle extending film 7 of the present embodiment, when the once set aperture ratio is desired to be changed, the area of the light transmitting portion 44 can be changed only by changing the dimensions of the opening 40h without changing the outer dimensions of each light-shielding layer 40. In other words, in a double circle configuring the outer shape of each light-shielding layer 40, the area of the light transmitting portion 44 can be changed only by changing the dimensions of the inner second circle 45b without changing the dimensions of the outer first circle 45a.

In the specific example described above, for example, when the aperture ratio is desired to be changed from 60% to 70%, since the dimensions of the outer shape (the first circle 45a) of the light-shielding layer 44 are not changed in the manufacturing method of the present embodiment, the aperture ratio when all of the inside of the firs circles 45a are assumed to be light-shielding layers is not changed at 50%. And, the dimensions of the opening 40h (the second circle 45b) are increased, thereby setting the dimensions of the second circle 45b so that the entire area of the openings corresponding to an aperture ratio of 20% is assigned to all of the light-shielding layers 40. As such, by increasing the dimensions of the opening 40h (the second circle 45b) without changing the dimensions of the outer shape (the first circle 45a) of the light-shielding layer 40, the aperture ratio can be increased from 60% to 70%. As such, by increasing the aperture ratio, light conventionally lost can be effectively used.

Therefore, according to the present embodiment, the aperture ratio can be adjusted only by changing the area of the opening 40h, and the outer dimensions, number, and arrangement of the respective light-shielding layers 40 do not have to be changed. Therefore, time and effort for design change can be reduced. Also, since one light-shielding layer 40 has a double circle, the area of the side surface 44c of the light transmitting portion 44 with respect to the area of one light-shielding layer 40 can be extremely increased. As a result, the degree of flexibility of adjustment of the tilt angle of the side surface 44c of the light transmitting portion 44 is increased, and therefore emission light with a desired angular distribution can be easily obtained.

In the method of manufacturing the viewing angle extending film 7, if a technique of irradiation with light from a coating film 48 side made of the transparent negative resist via a photo mask is assumed to be used in the process of patterning the light transmitting portion 44, it is extremely difficult to adjust alignment between the base material 39 having the light-shielding layers 40 of a fine size and the photo mask, and the occurrence of deviation is unavoidable. As a result, the light transmitting portion 44 and the light-shielding layer 40 may be overlaid with each other to decrease light transmittance. By contrast, in the case of the present embodiment, the transparent resin layer 41 is irradiated with the diffused light F from a back surface side of the base material 39 with the light-shielding layers 40 as a mask, and therefore the light transmitting portion 44 is formed as being self-aligned in the non-formation region of the light-shielding layers 40. As a result, the light transmitting portion 44 and the light-shielding layer 40 are not overlaid with each other, and light transmittance can be reliably maintained. Also, since a precise alignment work is not necessary, and therefore the time for manufacturing can be reduced.

If the light-shielding layers 40 are not present, external light entering the viewing angle extending film 7 from the visual recognition side is scattered on the surface of the base material 39. Then, external light scattering occurs to decrease viewability in a bright place. Furthermore, at the time of black display, "bright black" occurs, where black looks whitish, to decrease contrast, thereby making suitable image observation impossible. By contrast, in the viewing angle extending film 7 of the present embodiment, these problems can be solved by providing the plurality of light-shielding layers 40.

First Modification Example

Figure 8:
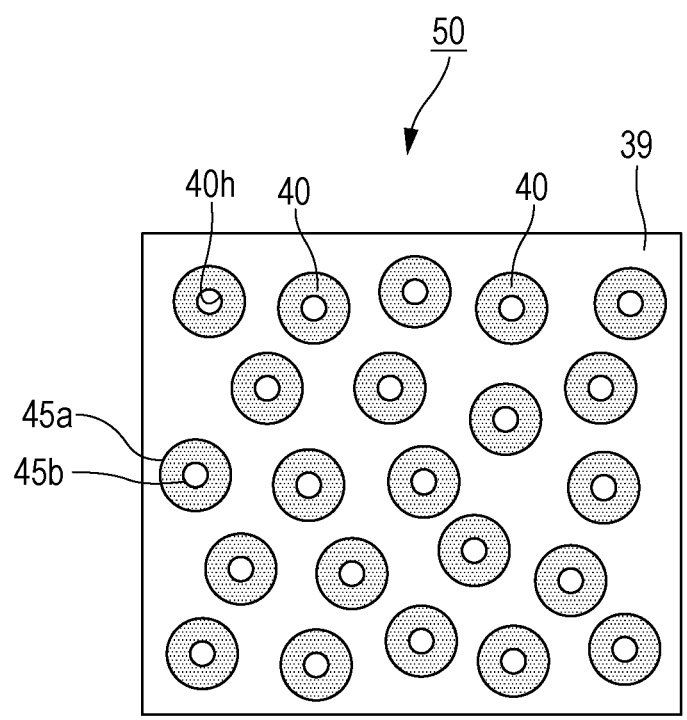
FIG. 8 is a plan view depicting a first modification example of the viewing angle extending film of the first embodiment.

In the embodiment described above, as depicted in FIG. 2A, the plurality of light-shielding layers 40 are regularly arranged. In place of this structure, in a viewing angle extending film 50 of the present modification example, as depicted in FIG. 8, the plurality of light-shielding layers 40 each having an annular planar shape are arranged in a random manner on the base material 39. Accordingly, the plurality of hollow portions formed on the same positions as those of the plurality of light-shielding layers 40 are also arranged in a random manner on the base material 39.

A process of manufacturing the viewing angle extending film 50 of the present modification example is similar to that in the embodiment described above. However, the plurality of light-shielding layers have to be arranged in a random manner on the base material 39. One example of a technique of designing a pattern having a plurality of light-shielding layers arranged in a random manner is described.

Figure 9A:
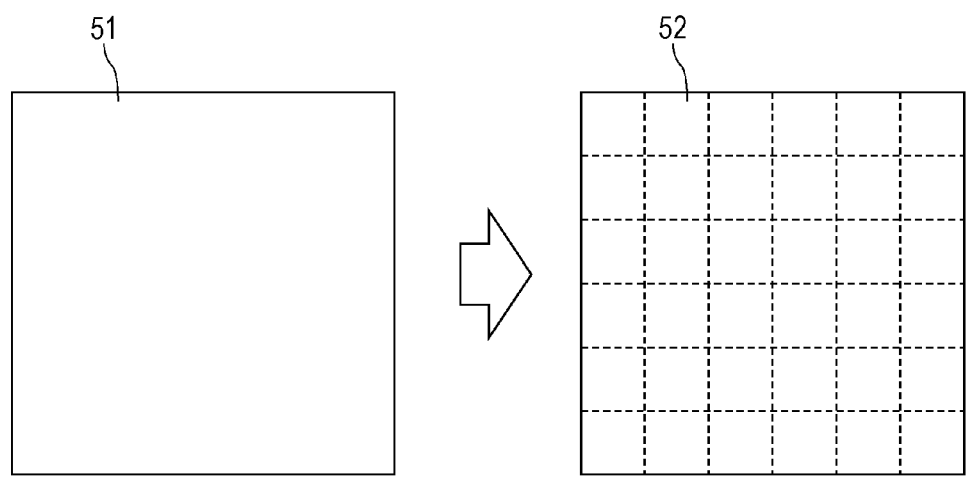
FIG. 9A is a diagram depicting an arrangement of a light-shielding portion of the viewing angle extending film of the first modification example.

Initially, as depicted in FIG. 9A, an entire rectangular region 51 identical in shape to the base material is divided into m×n (for example, 36) small regions 52 with m (for example, six) regions in height and n (for example, six) regions in width.

Next, as depicted in FIG. 9B, in each small region 52 obtained by division in the previous process, a pattern is formed so that the first circles 45a of the light-shielding layers are arranged in a closest packed state (a drawing on the left in FIG. 9B). Next, by using a random function, fluctuations are provided to position data serving as a positional reference of each circle such as, for example, the center coordinates of each circle, thereby fabricating position data of a plurality of types (for example, patterns of three types A, B, and C) (three drawings on the right in FIG. 9B).

Figure 9C:
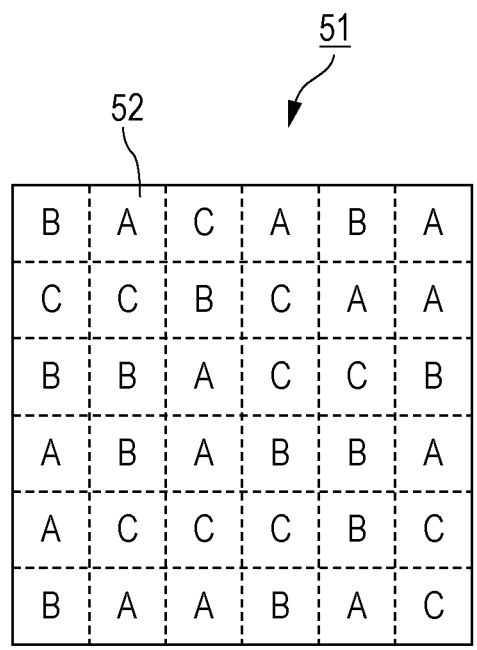
FIG. 9C is a diagram depicting an arrangement of the light-shielding portion of the viewing angle extending film of the first modification example.

Next, as depicted in FIG. 9C, the position data of the plurality of types A, B, and C fabricated in the previous process are allocated in a random manner to the m×n regions. For example, the position data A, B, and C are allocated to the respective small regions 52 so that the position data A, the position data B, and the position data C appear in 36 small regions 52 in a random manner. Therefore, when a photo mask 51 is viewed for each small region 52, the arrangement of the first circles 45a (the outer shapes of the light-shielding layer patterns) in each small region 52 applies to any pattern of the position data A, the position data B, and the position data C, and all light-shielding layer patterns in all regions are not arranged in a totally random manner. However, when the photo mask 51 is viewed as a whole, the plurality of light-shielding layer patterns are arranged in a random manner. That is, the light-shielding layers may not be arranged in a completely random manner over the entire base material.

In general, when patterns with regularity such as stripes and lattices are overlaid with each other, it is known that an interference pattern (moire) is visually recognized when the cycle of the respective patterns is slightly deviated. For example, when a viewing angle extending film with a plurality of light-shielding layers arranged in a matrix and a liquid-crystal panel with a plurality of picture elements arranged in a matrix are overlaid with each other, moire occurs between a cycle pattern of the light-shielding layers of the viewing angle extending film and a cycle pattern of the picture elements of the liquid-crystal panel, thereby possibly degrading display quality. By contrast, when the viewing angle extending film 50 of the present modification example is used, the plurality of light-shielding layers 40 are arranged in a planar, random manner, and therefore display quality can be maintained without the occurrence of moire due to interference between the layers and the regular arrangement of the picture elements of the liquid-crystal panel 4.

Second Modification Example

Figure 10A:
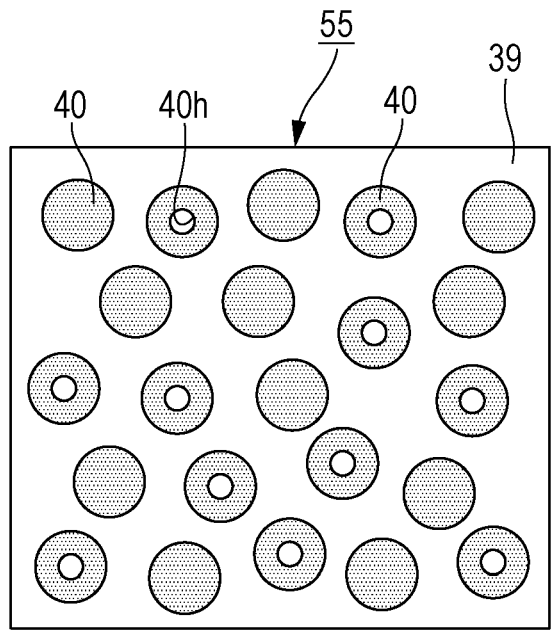
FIG. 10A is a plan view depicting a second modification example of the viewing angle extending film of the first embodiment.

In the viewing angle extending film 50 of the first modification example described above, every light-shielding layer 40 is provided with the opening 40h. In place of this structure, in a viewing angle extending film 55 of the present modification example, as depicted in FIG. 10A, part of the light-shielding layers 40 is provided with the opening 40h, and the remaining light-shielding layers 40 are not provided with the opening 40h. The plurality of light-shielding layers 40 are arranged in a random manner on the base material 39.

For example, as the specific example described above, the case is assumed in which, when a viewing angle extending film with an aperture ratio of 60% is manufactured, the first circles 45a are designed so that the aperture ratio is 50% when all of the inside of the first circles 45a are light-shielding layers and then an area with an aperture ratio of 10% is assigned to all of the first circles 45a to set the dimensions of the second circles 45b. In this case, if the area with the aperture ratio of 10% is assigned to all of the first circles 45a, the dimensions of the second circles 45b become too small, and the opening 40h may not be reliably formed, such as being crushed. In this case, the area with the aperture ratio of 10% may be assigned only to part of the first circles 45a. With this, the dimensions of the second circles 45b do not become too small, and the opening 40h can be reliably formed. As a result, the aperture ratio can be appropriately adjusted.

Third Modification Example

Figure 10B:
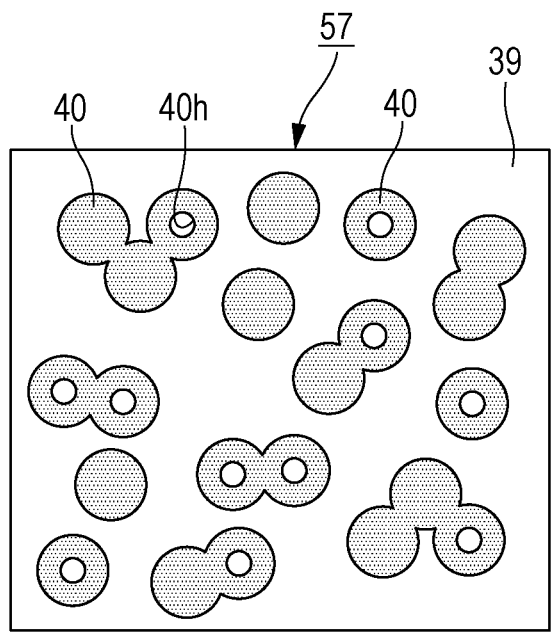
FIG. 10B is a plan view depicting a third modification example of the viewing angle extending film of the first embodiment.

In the viewing angle extending film 55 of the second modification example described above, all of the plurality of light-shielding layers 40 are arranged in a dotted manner. In place of this structure, in a viewing angle extending film 57 of the present modification example, regarding part of the light-shielding layers 40, adjacent light-shielding layers 40 are coupled together as depicted in FIG. 10B.

The plurality of light-shielding layers 40 are arranged in a random manner on the base material 39.

Fourth Modification Example

Figure 10C:
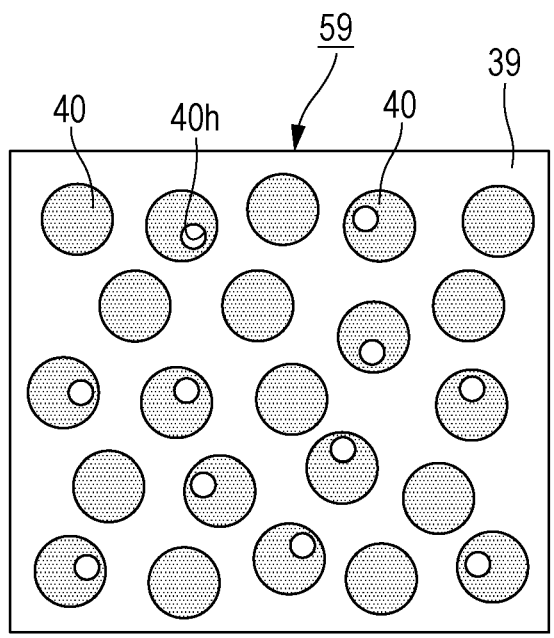
FIG. 10C is a plan view depicting a fourth modification example of the viewing angle extending film of the first embodiment.

In the viewing angle extending film 55 of the second modification example described above, the opening 40h is concentrically arranged inside the light-shielding layer 40. In place of this structure, in a viewing angle extending film 59 of the present modification example, the opening 40h is eccentrically arranged inside the light-shielding layer 40 as depicted in FIG. 10C. That is, the center of the first circle 45a forming the outline of the light-shielding layer 40 and the center of the second circle 45b do not coincide with each other. The plurality of light-shielding layers 40 are arranged in a random manner on the base material 39.

Fifth Modification Example

Figure 11A:
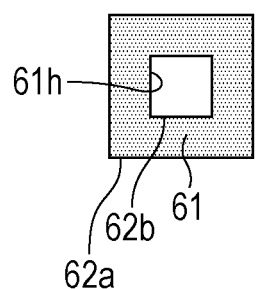
FIG. 11A is a plan view depicting a fifth modification example of the viewing angle extending film of the first embodiment.

In the viewing angle extending film 7 of the above-described embodiment, the planar shape of each light-shielding layer is an annular shape. In place of this structure, in the present modification example, the planar shape of each light-shielding layer 61 is a square ring shape, as depicted in FIG. 11A. That is, a second square 62b forming the outer shape of an opening 61h is concentrically arranged inside a first square 62a forming the outer shape of the light-shielding layer 61. Note that, as with the modification examples described above, the opening 61h may be provided only to part of the light-shielding layers 61. Also, the opening 61h may be eccentrically provided inside the light-shielding layer 61.

Sixth Modification Example

Figure 11B:
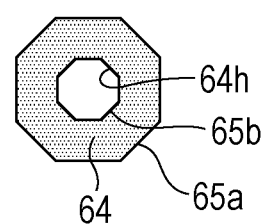
FIG. 11B is a plan view depicting a sixth modification example of the viewing angle extending film of the first embodiment.

In the present modification example, as depicted in FIG. 11B, the planar shape of each light-shielding layer 64 is a regular-octagonal ring shape. That is, a second regular octagon 65b forming the outer shape of an opening 64h is concentrically arranged inside a first regular octagon 65a forming the outer shape of the light-shielding layer 64. Note that, as with the modification example described above, the opening 64h may be provided only to part of the light-shielding layers 64. Also, the opening may be eccentrically provided inside the light-shielding layer 64.

Since the planar shape of the light-shielding layer 40 of the above-described embodiment is an annular shape, the sectional shape of the side surface 44c of the light transmitting portion 44, that is, the reflection surface, is also a circular shape. That is, the planar shape of the light-shielding layer 40 is an isotropic shape. Therefore, light reflected from the side surface 44c of the light transmitting portion 44 is diffused toward all directions at 360 degrees. By contrast, for example, with the light-shielding layer 61 in a square ring shape depicted in FIG. 11A, light is diffused toward a direction perpendicular to each side of the square.

With the light-shielding layer 64 in a regular-octagonal ring shape depicted in FIG. 11B, light can be diffused intensively to a vertical direction, a horizontal direction, and a diagonally 45-degree direction, in all of which viewing-angle performance is viewed as particularly important in the liquid-crystal display device. As such, when anisotropy of the viewing angle is demanded, different light diffusion performance can be obtained by changing the shape of the light-shielding portion as appropriate.

Also in the viewing angle extending films of the first to sixth modification examples described above, effects similar to those in the above-described embodiment can be obtained, such that time and effort for design change can be reduced when the aperture ratio is changed and emission light with a desired angular distribution can be easily obtained.

Second Embodiment

A second embodiment of the present invention is described below by using FIG. 12A and FIG. 12B.

The basic structure of the liquid-crystal display device of the present embodiment is identical to that of the first embodiment, except that the structure of the light-shielding layer of the viewing angle extending film is different from that of the first embodiment. Therefore, in the present embodiment, description of the basic structure of the liquid-crystal display device is omitted, and only the viewing angle extending film is described.

Figure 12A:
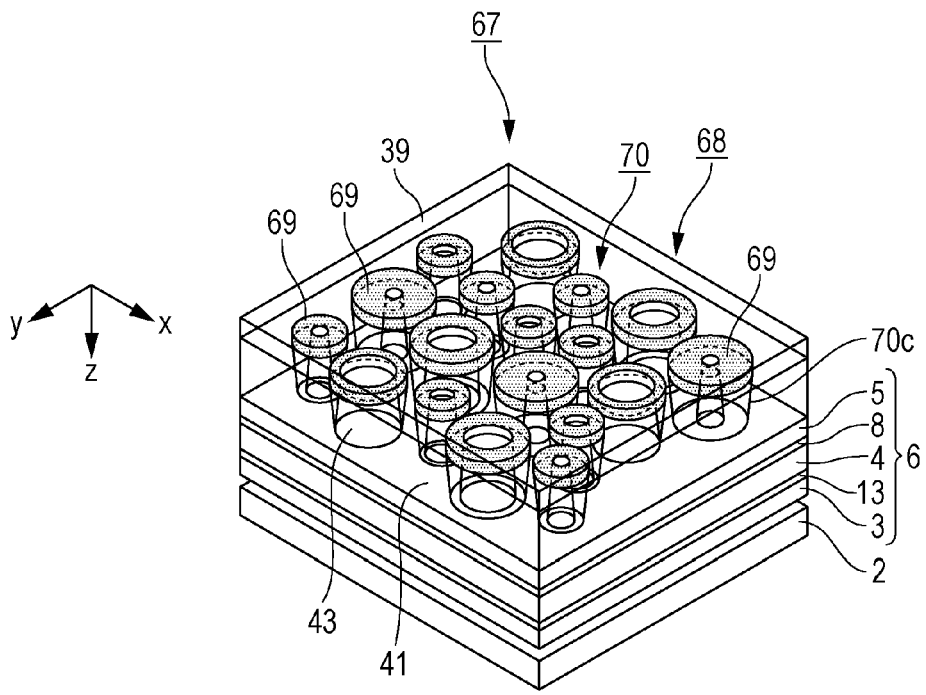
FIG. 12A is a perspective view depicting a liquid-crystal display device of a second embodiment.

FIG. 12A is a perspective view depicting a liquid-crystal display device 67 of the present embodiment. FIG. 12B is a plan view of a viewing angle extending film 68 of the present embodiment.

Figure 12B:
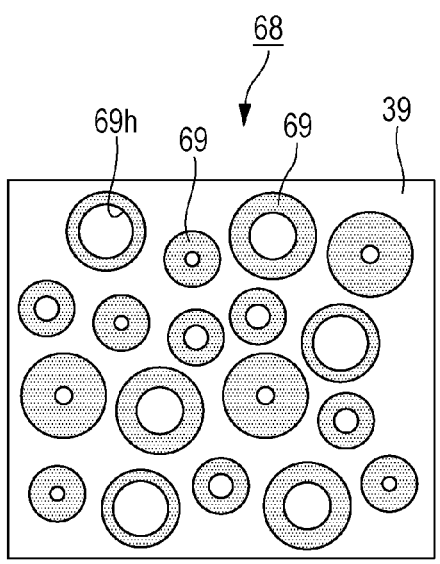
FIG. 12B is a plan view depicting the liquid-crystal display device of the second embodiment.

Also in FIG. 12A and FIG. 12B, each component common to that in the drawings used in the first embodiment is provided with the same reference numeral, and is not described in detail herein.

In the first embodiment, the plurality of light-shielding layers 40 all have the same dimensions. By contrast, in the viewing angle extending film 68 of the present embodiment, as depicted in FIG. 12A and FIG. 12B, the dimensions (diameters) of the plurality of light-shielding layers 69 and the dimensions (diameters) of an opening 69h differ from each other. For example, the diameters of the plurality of light-shielding layers 69 are distributed in a range of 10 μm to 25 μm. The tilt angle of each side surface 70c of a light transmitting portion 70 is the same. That is, the plurality of light-shielding layers 69 and the openings 69h have dimensions of a plurality of types. The side surface 70c of the light transmitting portion 70 has a tilt angle of one type. Also, as with the first modification example described above, the plurality of light-shielding layers 69 are arranged in a planar, random manner. Other structures are similar to those of the first embodiment.

Also in the viewing angle extending film 68 of the present embodiment, effects similar to those in the above-described first embodiment can be obtained, such that time and effort for design change can be reduced when the aperture ratio is changed and emission light with a desired angular distribution can be easily obtained.

In the case of the present embodiment, in addition to the random arrangement of the plurality of light-shielding layers 69, the dimensions of the light-shielding layers 69 differ from each other. Therefore, moire patterns due to an optical diffraction phenomenon can be more reliably suppressed. Furthermore, in addition to the dimensions of the light-shielding layers 69, the dimensions of the openings 69h differ from each other. Therefore, the degree of design flexibility can be enhanced.

Third Embodiment

A third embodiment of the present invention is described below by using FIG. 13.

The basic structure of the liquid-crystal display device of the present embodiment is identical to that of the first embodiment, except that the structure of the light-shielding layer of the viewing angle extending film is different from that of the first embodiment. Therefore, in the present embodiment, description of the basic structure of the liquid-crystal display device is omitted, and only the viewing angle extending film is described.

Figure 13:
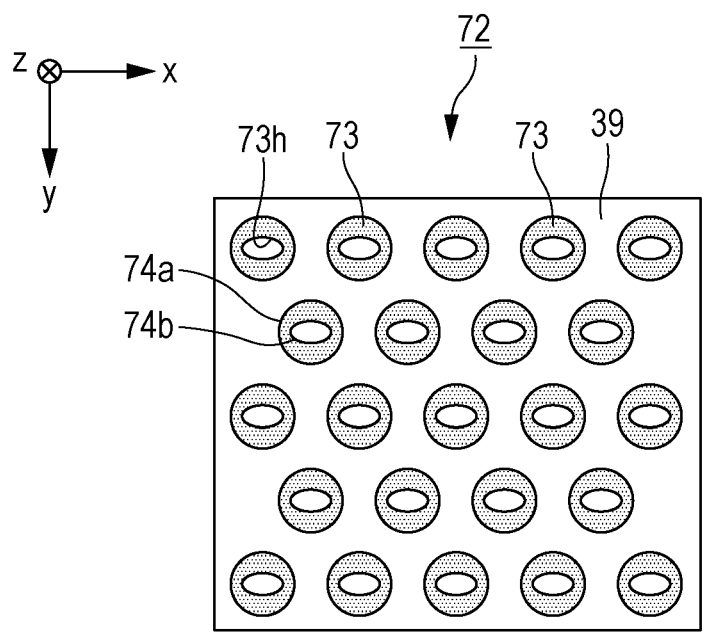
FIG. 13 is a plan view depicting a viewing angle extending film of a third embodiment.

FIG. 13 is a plan view of a viewing angle extending film of the present embodiment.

Also in FIG. 13, each component common to that in the drawings used in the first embodiment is provided with the same reference numeral, and is not described in detail herein.

In the viewing angle extending film 7 of the first embodiment, each light-shielding layer 40 has an annular shape, and the first figure forming the outer shape of the light-shielding layer 40 and the second figure forming the shape of the opening are both perfect circles. By contrast, in a viewing angle extending film 72 of the present embodiment, as depicted in FIG. 13, each light-shielding layer 73 has an annular shape, which is similar to the first embodiment. However, the first figure forming the outer shape of the light-shielding layer 73 is a circle 74a, the second figure forming the shape of an opening 73h is an oval 74b, and the circle 74a and the oval 74b are concentrically arranged. That is, the first figure is an isotropic shape, and the second figure is an anisotropic shape. The oval 74b forming the opening 73h is arranged so as to be horizontally elongated in FIG. 13 in a manner such that the major axis is in the x axis direction and the minor axis is in the y axis direction. As with the first embodiment, the plurality of light-shielding layers 73 are regularly arranged, but may be arranged in a random manner.

Also in the viewing angle extending film 72 of the present embodiment, effects similar to those in the above-described first and second embodiments can be obtained, such that time and effort for design change can be reduced when the aperture ratio is changed and emission light with a desired angular distribution can be easily obtained.

In the case of the present embodiment, since the planar shape of the opening 73h of the light-shielding layer 73 is an oval shape, the sectional shape of a side surface (reflection surface) of the side surfaces of the light transmitting portion at a position corresponding to the opening 73h is also an oval shape. As a result, in the viewing angle extending film 72 of the present embodiment, light diffusion in a direction perpendicular to the major axis of the oval 74b forming the opening is stronger than light diffusion in a direction perpendicular to the minor axis. Thus, it is possible to achieve a viewing angle extending film with different intensities of light diffusion in a vertical direction (an upper-and-lower direction) and a horizontal direction (a leftward-and-rightward direction) in accordance with the arrangement of the oval 74b forming the opening 73h. That is, the viewing angle extending film 72 of the present embodiment has anisotropic light diffusion performance.

First Modification Example

Figure 14A:
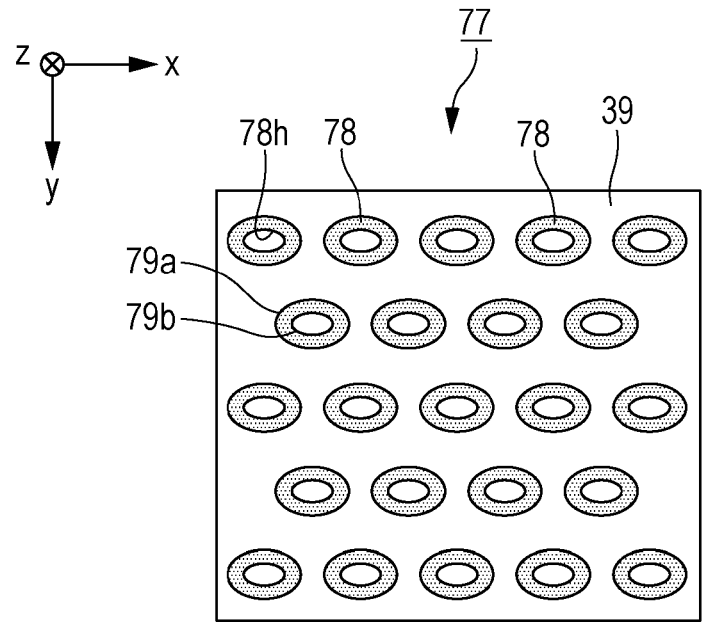
FIG. 14A is a plan view depicting a first modification example of the viewing angle extending film of the third embodiment.

In the viewing angle extending film 72 of the above-described embodiment, the first figure forming the outer shape of the light-shielding layer 73 is a circle, and the second figure forming the shape of the opening 73h is an oval. In place of this structure, in a viewing angle extending film 77 of the present modification example, as depicted in FIG. 14A, the first figure forming the outer shape of a light-shielding layer 78 and the second figure forming the shape of an opening 78h are both ovals. The two ovals 79a and 79b are concentrically arranged. The plurality of light-shielding layers 78 are regularly arranged on the base material 39.

Second Modification Example

Figure 14B:
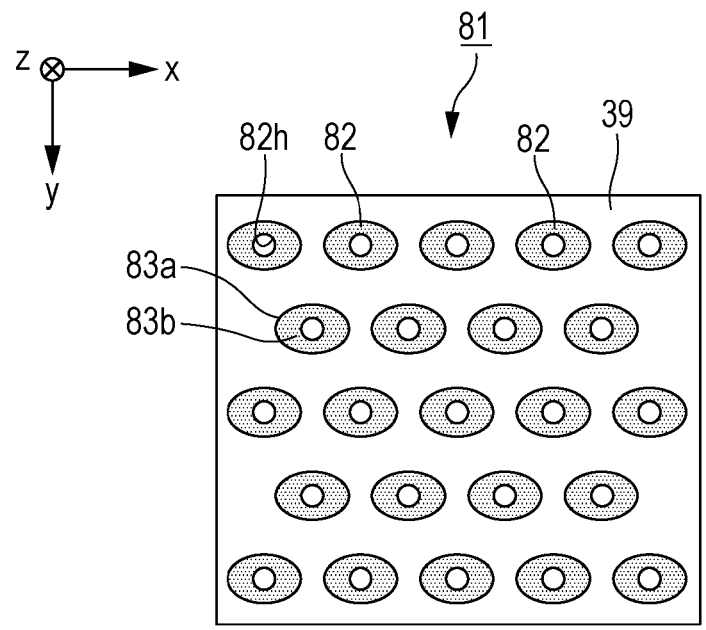
FIG. 14B is a plan view depicting a second modification example of the viewing angle extending film of the third embodiment.

In a viewing angle extending film 81 of the present modification example, as depicted in FIG. 14B, the first figure forming the outer shape of a light-shielding layer 82 is an oval 83a, and the second figure forming the shape of an opening 82h is a circle 83b. The oval 83a and the circle 83b are concentrically arranged. The plurality of light-shielding layers 82 are regularly arranged on the base material 39.

Third Modification Example

Figure 15A:
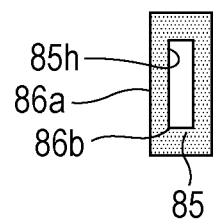
FIG. 15A is a plan view depicting a third modification example of the viewing angle extending film of the third embodiment.

In the viewing angle extending film 77 of the first modification example, the first figure forming the outer shape of the light-shielding layer 78 and the second figure forming the shape of the opening 78h are both ovals, 79a and 79b, respectively. By contrast, in the present modification example, as depicted in FIG. 15A, the first figure forming the outer shape of a light-shielding layer 85 and the second figure forming the shape of an opening 85h are both rectangles, 86a and 86b, respectively. The two rectangles 86a and 86b are concentrically arranged. Note that while the light-shielding layer 78 is arranged so as to be vertically elongated in FIG. 15A, the light-shielding layer 78 may be arranged so as to be horizontally elongated.

Fourth Modification Example

Figure 15B:
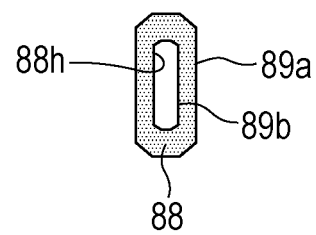
FIG. 15B is a plan view depicting a fourth modification example of the viewing angle extending film of the third embodiment.

In the present modification example, as depicted in FIG. 15B, the first figure forming the outer shape of a light-shielding layer 88 and the second figure forming the shape of an opening 88h are both elongated octagons, 89a and 89b, respectively. The two octagons 89a and 89b are concentrically arranged. Note that while the light-shielding layer 88 is arranged so as to be vertically elongated in FIG. 15B, the light-shielding layer 88 may be arranged so as to be horizontally elongated.

Also in the viewing angle extending films of the first to fourth modification examples described above, effects similar to those in the above-described first to third embodiments can be obtained, such that time and effort for design change can be reduced when the aperture ratio is changed and emission light with a desired angular distribution can be easily obtained. Furthermore, also in these modification examples, since at least one of the first figure and the second figure has an anisotropic shape, an effect similar to that of the third embodiment can be obtained, such that a viewing angle extending film with anisotropic light diffusion performance can be achieved.

Fourth Embodiment

A fourth embodiment of the present invention is described below by using FIG. 16.

The basic structure of the liquid-crystal display device of the present embodiment is identical to that of the first embodiment, except that the shape of the light transmitting portion of the viewing angle extending film is different from that of the first embodiment. Therefore, in the present embodiment, description of the basic structure of the liquid-crystal display device is omitted, and only the viewing angle extending film is described.

Figure 16:
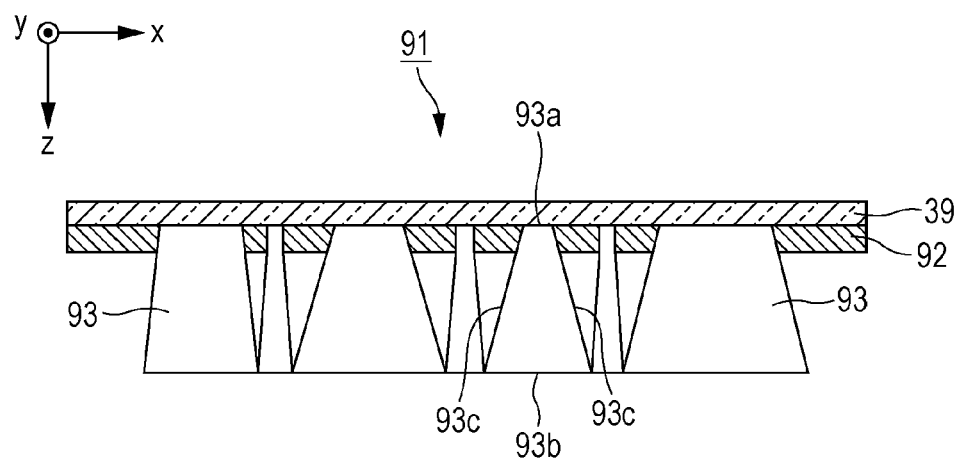
FIG. 16 is a sectional view depicting a viewing angle extending film of a fourth embodiment.

FIG. 16 is a sectional view depicting the viewing angle extending film of the present embodiment. In FIG. 16, each component common to that in the drawings used in the first embodiment is provided with the same reference numeral, and is not described in detail herein.

In the first embodiment, the plurality of light-shielding layers 40 has the same dimensions. By contrast, in a viewing angle extending film 91 of the present embodiment, as depicted in FIG. 16, the dimensions of the plurality of light-shielding layers 92 differ from each other, and the tilt angles of side surfaces 93c of light transmitting portions 93 differ from each other. That is, when the plurality of light transmitting portions 93 are viewed as a whole, the plurality of light-shielding layers 92 have dimensions of a plurality of types, and the side surfaces 93c of the plurality of light transmitting portions 93 have tilt angles of a plurality of types. Other structures are similar to those of the first embodiment.

Also in the viewing angle extending film 91 of the present embodiment, effects similar to those in the above-described first to third embodiments can be obtained, such that time and effort for design change can be reduced when the aperture ratio is changed and emission light with a desired angular distribution can be easily obtained.

Furthermore, according to the viewing angle extending film 91 of the present embodiment, since the tilt angles of the side surfaces 93c of the plurality of light transmitting portions 93 differ from each other, the emission angle distribution of light can be extended by interpolation among the plurality of light transmitting portions 93 with different tilt angles of the side surfaces 93c. As a result, when the liquid-crystal display device is observed with different angles, luminance is gently changed in accordance with the observation angle, and viewing angle performance can be enhanced.

Note that because the tilt angles of the side surfaces 93c of the light transmitting portions 93 are of a plurality of types in the present embodiment, luminance is gently changed, which is preferable. However, the effect of enhancing viewing angle performance can also be obtained only by setting two types of tilt angle so that the tilt angles of at least part of the light transmitting portions 93 are made different from those of other light diffusing portions 93.

Fifth Embodiment

A fifth embodiment of the present invention is described below by using FIG. 17.

The basic structure of the liquid-crystal display device of the present embodiment is identical to that of the first embodiment, except that the shape of the light transmitting portion of the viewing angle extending film is different from that of the first embodiment. Therefore, in the present embodiment, description of the basic structure of the liquid-crystal display device is omitted, and only the viewing angle extending film is described.

Figure 17:
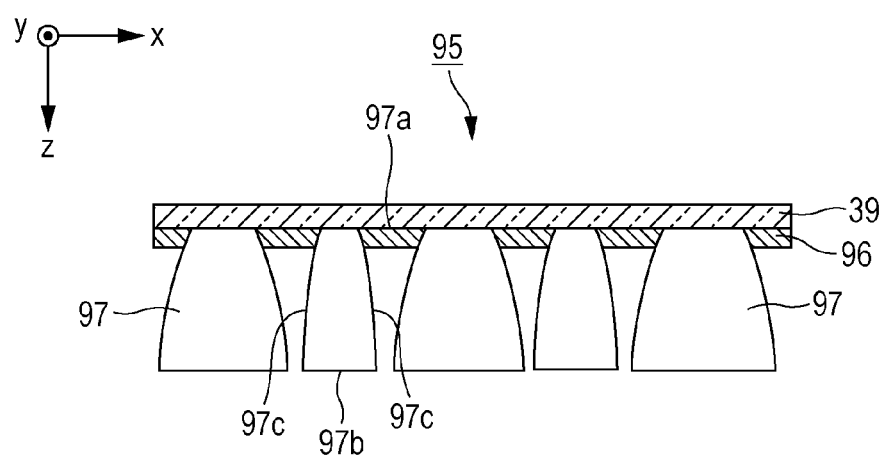
FIG. 17 is a sectional view depicting a viewing angle extending film of a fifth embodiment.

FIG. 17 is a sectional view of the viewing angle extending film of the present embodiment. In FIG. 17, each component common to that in the drawings used in the first embodiment is provided with the same reference numeral, and is not described in detail herein.

In the above-described first embodiment, when attention is focused on one light transmitting portion 44, the side surface 44c of the light transmitting portion 44 has a constant tilt angle. By contrast, in a viewing angle extending film 95 of the present embodiment, as depicted in FIG. 17, side surfaces 97c of light transmitting portions 97, which are a part other than light-shielding layers 96, are each gently curved in a convex shape from a light emission end face 97a toward a light incident end face 97b, and have different tilt angles depending on the location. Other structures are similar to those of the first embodiment.

Also in the viewing angle extending film 95 of the present embodiment, effects similar to those in the above-described first to fourth embodiments can be obtained, such that time and effort for design change can be reduced when the aperture ratio is changed and emission light with a desired angular distribution can be easily obtained.

When the tilt angle of the side surface of the light transmitting portion is constant, display unevenness may be visually recognized depending on the observation angle when the observation angle is changed along a horizontal direction or a vertical direction of the screen. To address this display unevenness, in the fourth embodiment, the side surfaces 93c have tilt angles of a plurality of types in the plurality of light transmitting portions 93 as a whole. By contrast, in the viewing angle extending film 95 of the present embodiment, the tilt angles differ depending on the location of the side surface 96c even in each light transmitting portion 96. Thus, the emission angle distribution of light is extended compared with the case in which the tilt angle of the side surface is constant. With this, luminance is gently changed in accordance with the observation angle, and viewing angle performance can be enhanced.

Sixth Embodiment

A sixth embodiment of the present invention is described below by using FIG. 18A and FIG. 18B.

The basic structure of a liquid-crystal display device of the present embodiment is identical to that of the first embodiment, except that the structure of the viewing angle extending film is different from that of the first embodiment. Therefore, in the present embodiment, description of the basic structure of the liquid-crystal display device is omitted, and only the viewing angle extending film is described.

Figure 18A:
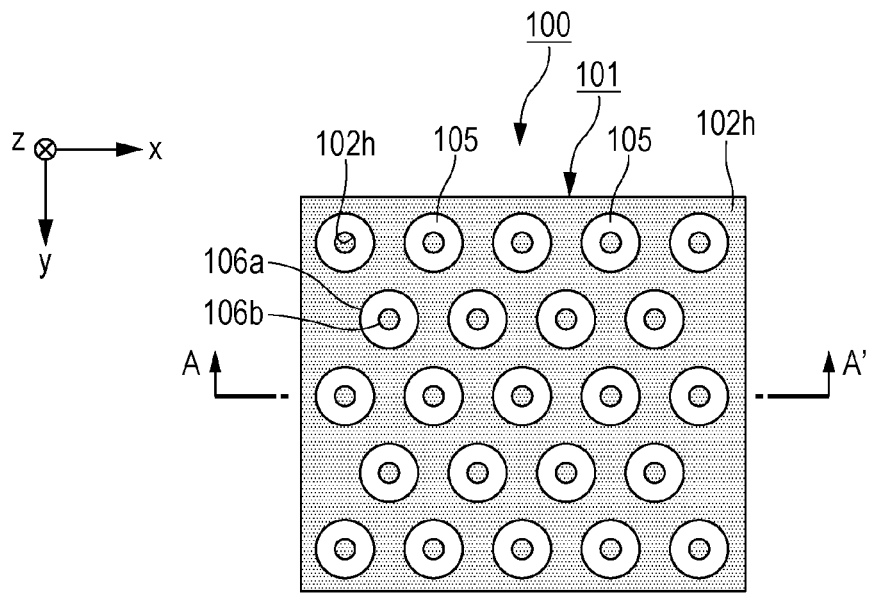
FIG. 18A is a plan view depicting a liquid-crystal display device of a sixth embodiment.
Figure 18B:
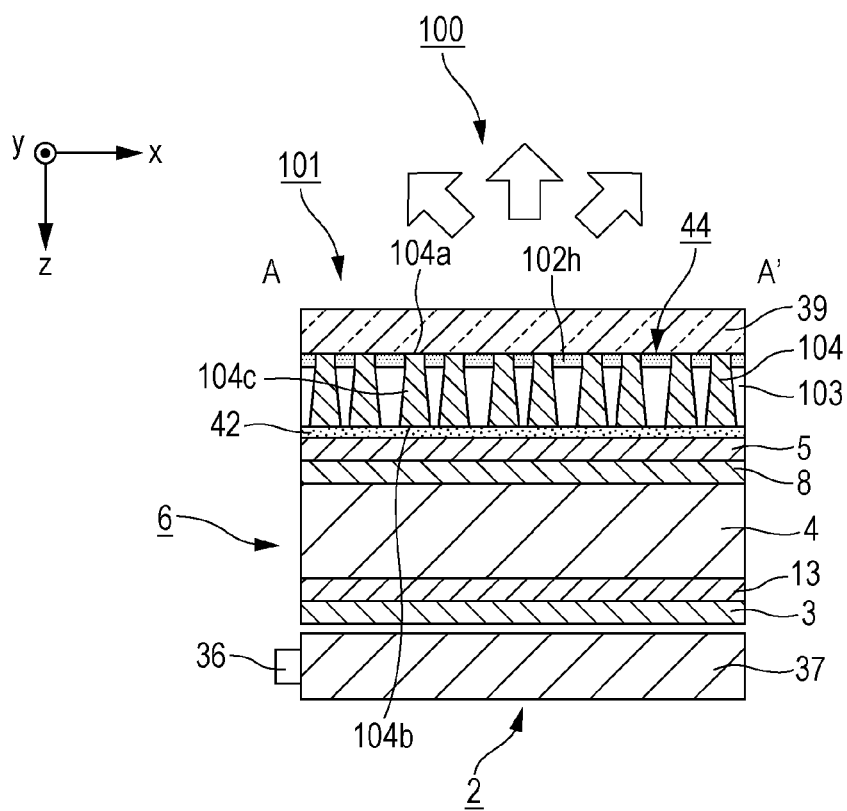
FIG. 18B is a sectional view depicting a liquid-crystal display device of the sixth embodiment.

FIG. 18A is a plan view depicting a liquid-crystal display device 100 of the present embodiment, and FIG. 18B is a sectional view along an A-A' line of FIG. 18A. In FIG. 18A and FIG. 18B, each component common to that in the drawings used in the first embodiment is provided with the same reference numeral, and is not described in detail herein.

In a viewing angle extending film 101 of the present embodiment, as depicted in FIG. 18A and FIG. 18B, a region where light-shielding layers 102 and hollow portions 103 are present and a region where light transmitting portions 104 are present are reversed, compared with the viewing angle extending film of the first embodiment. That is, while the viewing angle extending film 7 of the first embodiment has the light transmitting portions 44 each in a frustum shape, the viewing angle extending film 101 of the present embodiment is provided with the light-shielding layers 102 in a part of a frustum-shaped space in contact with the base material 39 and the hollow portions 103 in a part other than the above-described part. The light transmitting portions 104 are provided in a region other than a formation region of the light-shielding layers 102.

The light-shielding layers 102 of the present embodiment are provided over the entire surface of the base material 39, a plurality of circular openings 102h are provided so as to be dotted, and the circular light-shielding layers 102 are further provided inside the respective openings 102h. Thus, the planar shape of each opening 102h is an annular shape. In the case of the present embodiment, the first figure forming the outer shape of the opening 102h and the second figure forming the outer shape of the light-shielding layer 102 are both circles, 106a and 106b, respectively. The outer edge of the opening 102h and the outer edge of the inner light-shielding layer 102 are concentrically arranged. Note that while the plurality of openings 102h are cyclically arranged in the present embodiment, the plurality of openings 102h may be non-cyclically arranged. Also, while the dimensions of the plurality of openings 102h are the same in the present embodiment, the dimensions of the plurality of openings 102h may differ from each other.

When the viewing angle extending film 101 of the present embodiment is manufactured, a technique of designing patterns of the light-shielding layers 102 (openings 102h) is different from that of the first embodiment.

As a first stage of pattern designing, a plurality of first circles 106a (first figures) as the openings 102h are arranged so as to be dotted in a predetermined region. Next, as a second stage, the second circle 106b (second figure) as the light-shielding layer 102 is arranged so as to be contained in each first circle 106a.

Here, for example, when the viewing angle extending film 101 with an aperture ratio of 60% is manufactured, in a first stage, the number and dimensions of the first circles 106a are set so that, for example, the aperture ratio is 70% on the assumption that all of the inside of the first circles 106a are the openings. Next, as a second stage, with an area with the aperture ratio decreased by 10% assigned to all of the first circles 106a, the dimensions of the second circles 106b are set. As such, by arranging each second circle 106b serving as the light-shielding layer 102 inside the first circle 106a, 70%, which is the aperture ratio when all of the inside of the first circles 106a are assumed to be the openings, can be decreased to 60%, thereby obtaining a desired aperture ratio.

Next, based on the designed patterns, the light-shielding layers 102 are formed on the base material. The processes onward are similar to those in the first embodiment.

Also in the viewing angle extending film 101 of the present embodiment, effects similar to those in the above-described first to fifth embodiments can be obtained, such that time and effort for design change can be reduced when the aperture ratio is changed and emission light with a desired angular distribution can be easily obtained.

First Modification Example

Figure 19A:
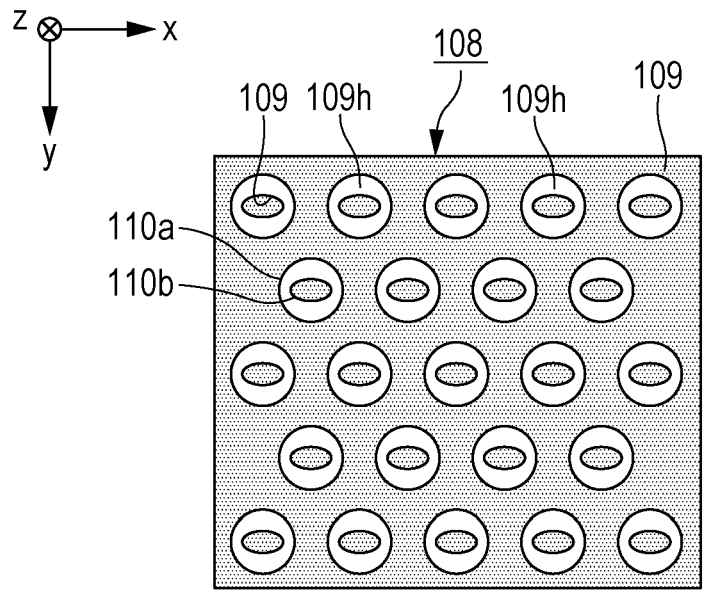
FIG. 19A is a plan view depicting a first modification example of the viewing angle extending film of the sixth embodiment.

In the viewing angle extending film 101 of the above-described sixth embodiment, the opening 102h has an annular shape, and the first figure forming the outer shape of the opening 102h and the second figure forming the shape of the light-shielding layer 102 are both circles, 106a and 106b, respectively. By contrast, in a viewing angle extending film 108 of the present modification example, as depicted in FIG. 19A, the first figure forming the outer shape of an opening 109h is a circle 110a, and the second figure forming the shape of a light-shielding layer 109 is an oval 110b. The circle 110a and the oval 110b are concentrically arranged. That is, the first figure is an isotropic shape, and the second figure is an anisotropic shape. The oval 110b forming the light-shielding layer 109 is arranged so as to be horizontally elongated in FIG. 19A in a manner such that the major axis is in the x axis direction and the minor axis is in the y axis direction.

As with the sixth embodiment, the plurality of openings 109h are regularly arranged, but may be arranged in a random manner.

In the case of the present modification example, since the light-shielding layer 109 inside each opening 109h is in an oval shape, the sectional shape of a side surface (reflection surface) of the side surfaces of the light transmitting portion at a position corresponding to the light-shielding layer 109 is also an oval shape. As a result, in the viewing angle extending film 108 of the present modification example, light diffusion in a direction perpendicular to the major axis of the oval 110b forming the light-shielding layer 109 is stronger than light diffusion in a direction perpendicular to the minor axis. Thus, it is possible to achieve a viewing angle extending film with different intensities of light diffusion in a vertical direction (an upper-and-lower direction) and a horizontal direction (a leftward-and-rightward direction) in accordance with the arrangement of the oval 110b forming the light-shielding layer 109. That is, the viewing angle extending film of the present modification example has anisotropic light diffusion performance.

Second Modification Example

Figure 19B:
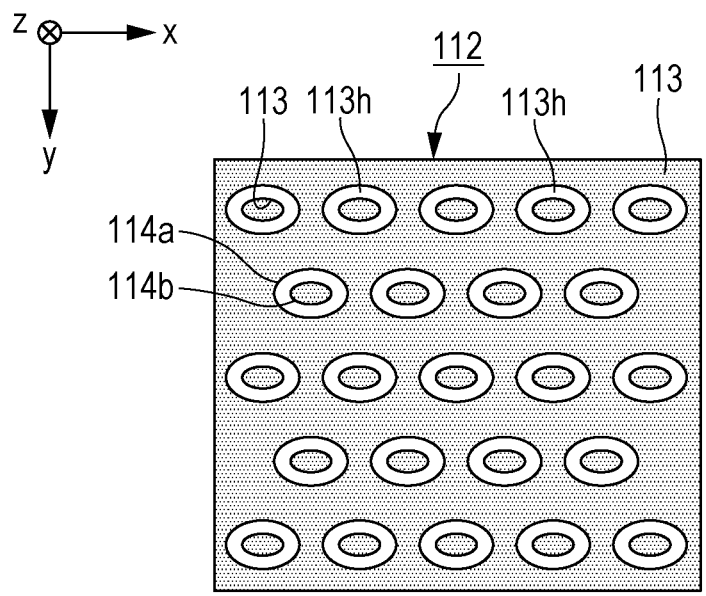
FIG. 19B is a plan view depicting the first modification example of the viewing angle extending film of the sixth embodiment.

In the viewing angle extending film 108 of the above-described first modification example, the first figure forming the outer shape of the opening 109h is the circle 110a, and the second figure forming the shape of the light-shielding layer 109 is the oval 110b. In place of this structure, in a viewing angle extending film 112 of the present modification example, as depicted in FIG. 19B, the first figure forming the outer shape of an opening 113h and the second figure forming the shape of a light-shielding layer 113 are both ovals, 114a and 114b, respectively. The two ovals 114a and 114b are concentrically arranged. The plurality of openings 113h are regularly arranged on the base material 39.

Third Modification Example

Figure 19C:
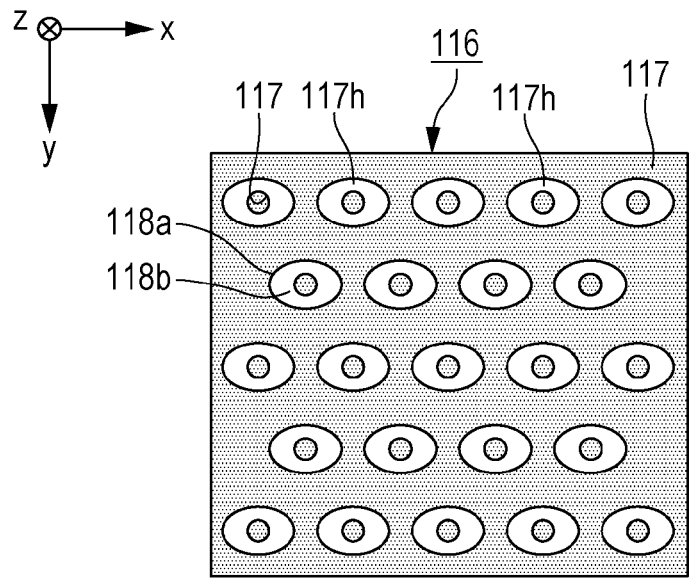
FIG. 19C is a plan view depicting the first modification example of the viewing angle extending film of the sixth embodiment.

In a viewing angle extending film 116 of the present modification example, as depicted in FIG. 19C, the first figure forming the outer shape of an opening 117h is an oval 118a, and the second figure forming the shape of a light-shielding layer 117 is a circle 118b. The oval 118a and the circle 118b are concentrically arranged. The plurality of openings 117h are regularly arranged on the base material 39.

Also in the viewing angle extending films of the first to third modification examples, effects similar to those in the above-described first to sixth embodiments can be obtained, such that time and effort for design change can be reduced when the aperture ratio is changed and emission light with a desired angular distribution can be easily obtained. Furthermore, also in the viewing angle extending films of the second and third modification examples, since at least one of the first figure and the second figure has an anisotropic shape, an effect similar to that of the first modification example can be obtained, such that a viewing angle extending film with anisotropic light diffusion performance can be achieved.

Other Modification Examples

Figure 20A:
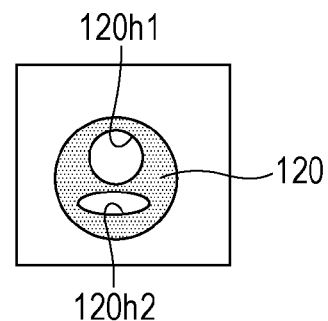
FIG. 20A is a plan view depicting a modification example of the viewing angle extending film.

For example, as depicted in FIG. 20(A), a plurality of openings 120h1 and 120h2 may be provided inside one light-shielding layer 120. In this case, the opening 120h1 in an isotropic shape and the opening 120h2 in an anisotropic shape may be present in a mixed manner. In a viewing angle extending film of the present modification example, two openings 120h1 and 120h2 are provided inside the circular light-shielding layer 120, and one opening 120h1 is in a circular shape (an isotropic shape) and one opening 120h2 is in an oval shape (an anisotropic shape). While two openings are provided herein, three or more openings may be provided.

Figure 20B:
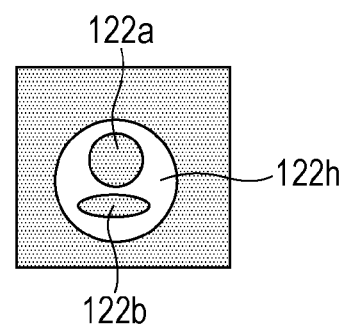
FIG. 20B is a plan view depicting a modification example of the viewing angle extending film.

Alternatively, as a viewing angle extending film depicted in FIG. 20B, a plurality of light-shielding layers 122a and 122b may be provided inside one opening 122h. In this case, the light-shielding layer 122a in an isotropic shape and the light-shielding layer 122b in an anisotropic shape may be present in a mixed manner. In the viewing angle extending film of the present modification example, two light-shielding layers 122a and 122b are provided inside the circular opening 122h, and one light-shielding layer 122a is in a circular shape (an isotropic shape) and one light-shielding layer 122b is in an oval shape (an anisotropic shape). While two light-shielding layers are provided herein, three or more light-shielding layers may be provided.

Figure 21A:
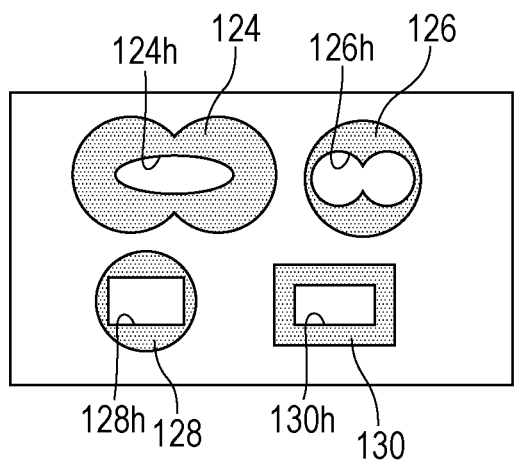
FIG. 21A is a plan view depicting a modification example of the viewing angle extending film.

Alternatively, as depicted in FIG. 21A, a light-shielding layer 124 having two circles coupled together and an oval opening 124h provided inside the circles, a light-shielding layer 126 having an opening 126h in a shape having two circles coupled together inside one circle, a light-shielding layer 128 having a rectangular opening 128h provided inside a circle, a light-shielding layer 130 having a rectangular opening 130h provided inside a rectangle, or the like may be used.

Figure 21B:
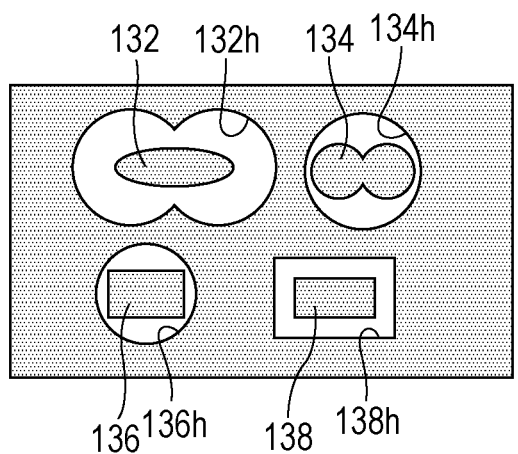
FIG. 21B is a plan view depicting a modification example of the viewing angle extending film.

Alternatively, as depicted in FIG. 21B, an opening 132h having two circles coupled together and an oval light-shielding layer 132 provided inside the circles, an opening 134h having a rectangular light-shielding layer 134 in a shape having two circles coupled together inside one circle, an opening 136h having a rectangular light-shielding layer 136 provided inside a circle, an opening 138h having a rectangular light-shielding layer 138 provided inside a rectangle, or the like may be used.

Figure 22A:
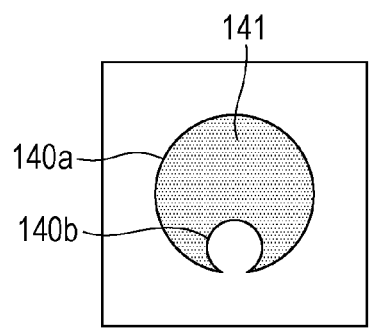
FIG. 22A is a plan view depicting a modification example of the viewing angle extending film.

Also, the second figure may not be completely contained inside the first figure. For example, as depicted in FIG. 22A, a circle 140a as the first figure and a circle 140b as the second figure may be partially overlaid with each other, and a part surrounded by the two circles 140a and 140b may be a light-shielding layer 141.

Figure 22B:
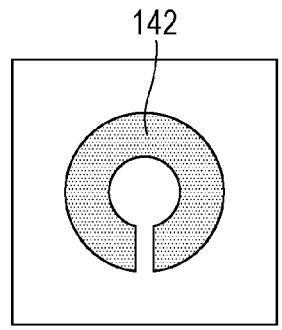
FIG. 22B is a plan view depicting a modification example of the viewing angle extending film.

Furthermore, the light-shielding layer may not be in a completely-closed annular shape. For example, as depicted in FIG. 22B, the light-shielding layer may be a light-shielding layer 142 in a shape of a ring partially broken.

Figure 22C:
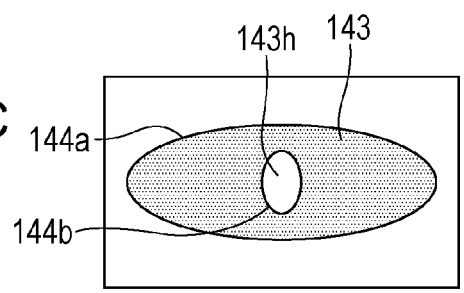
FIG. 22C is a plan view depicting a modification example of the viewing angle extending film.

Still further, when an oval is arranged inside an oval, the major axis directions of both ovals may not coincide with each other, and the minor axis directions thereof may not coincide with each other. For example, as a light-shielding layer 143 depicted in FIG. 22C, the major axis direction of an oval 144b as an opening 143h may be orthogonal to the major axis direction of an oval 144a as the outer shape of a light-shielding layer 143.

Figure 22D:
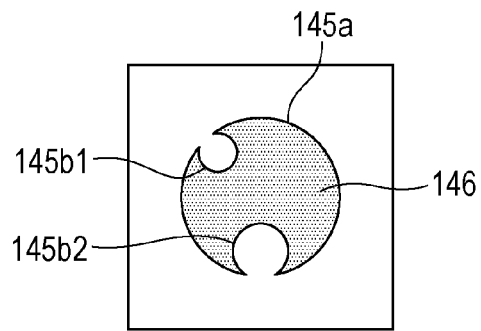
FIG. 22D is a plan view depicting a modification example of the viewing angle extending film.

Still further, as depicted in FIG. 22D, a circle 145a as the first figure and two circles 145b1 and 145b2 as second figures may be partially overlaid with one another, and a part surrounded by the figures may be a light-shielding layer 146.

Figure 23A:
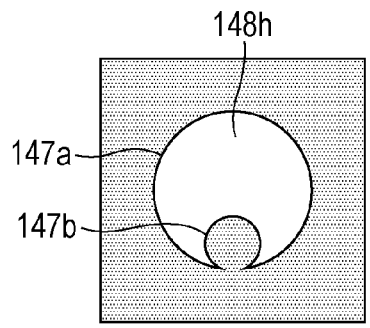
FIG. 23A is a plan view depicting a modification example of the viewing angle extending film.

Similarly, as depicted in FIG. 23A, a circle 147a as the first figure and a circle 147b as a second figure may be partially overlaid with each other, and a part surrounded by the two circles 147a and 147b may be an opening 148h.

Figure 23B:
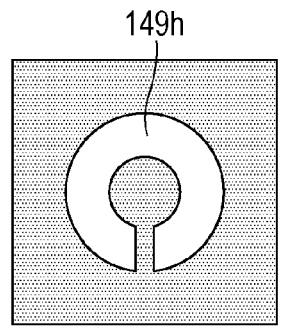
FIG. 23B is a plan view depicting a modification example of the viewing angle extending film.

Still further, as depicted in FIG. 23B, an opening 149h in a shape of a ring partially broken may be provided.

Figure 23C:
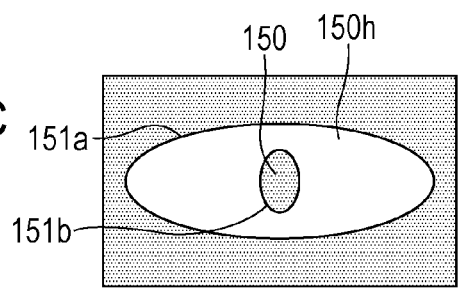
FIG. 23C is a plan view depicting a modification example of the viewing angle extending film.

Still further, when an oval is arranged inside an oval, as an opening 150h depicted in FIG. 23C, the major axis direction of an oval 151b forming a light-shielding layer 150 may be orthogonal to the major axis direction of an oval 151a forming the outer shape of the opening 150h.

Figure 23D:
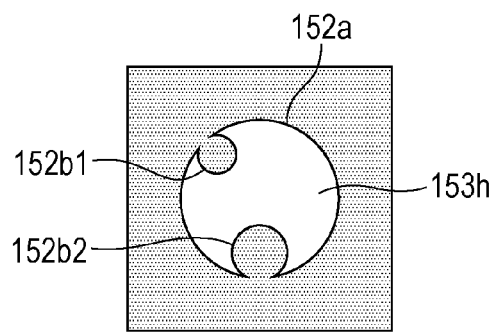
FIG. 23D is a plan view depicting a modification example of the viewing angle extending film.

Still further, as depicted in FIG. 23D, a circle 152a as the first figure and two circles 152b1 and 152b2 as second figures may be partially overlaid with one another, and a part surrounded by the figures may be an opening 153h.

Figure 24:
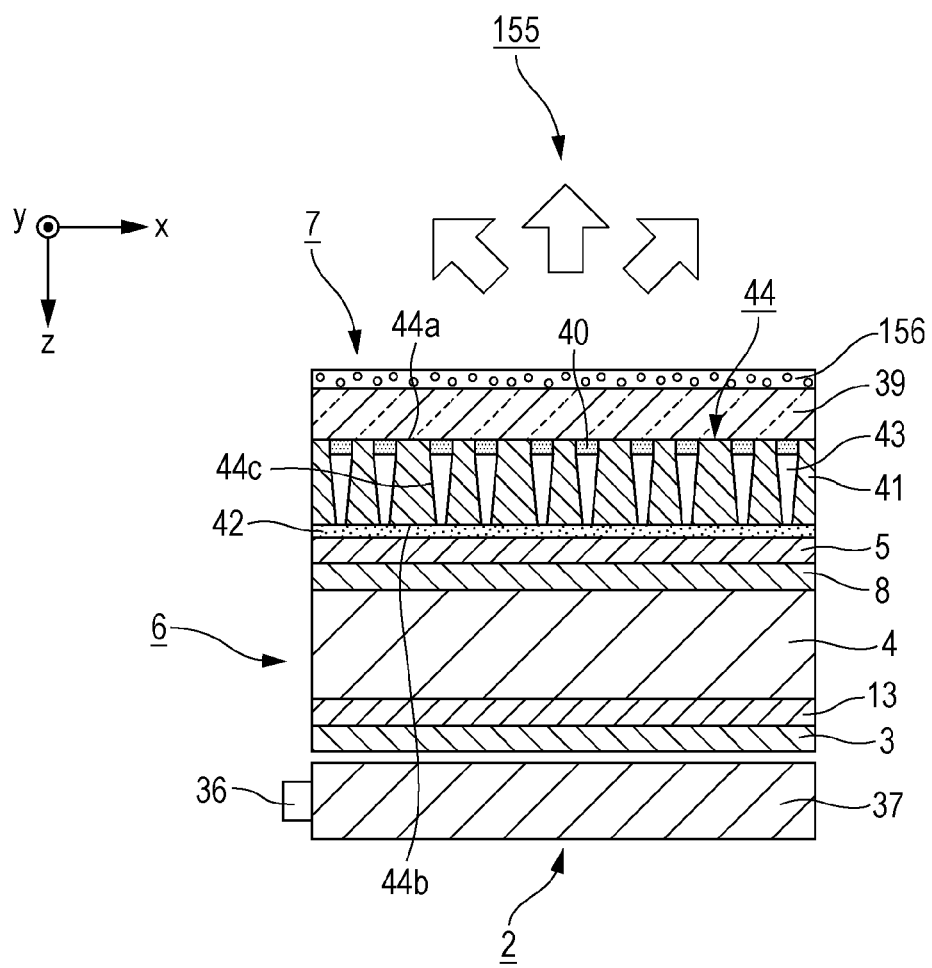
FIG. 24 is a sectional view depicting a modification example of the viewing angle extending film.

Still further, as a liquid-crystal display device 155 depicted in FIG. 24, a light scattering film 156 (a light scattering layer) may be arranged on a visual recognition side of the base material 39 of the viewing angle extending film 7. According to this structure, light emitted from the base material 39 is scattered by the light scattering film 156. Thus, the angular distribution of emission light does not lean to a specific angle, and a gentle angular distribution can be obtained. Note that it is not necessary to be able to handle the light scattering layer separately as a film, and the light scattering layer may be any as long as it is formed in a layer shape. In this case, the light scattering layer does not have to be arranged on the uppermost surface, and may be arranged in any manner as long as it is arranged on a light emission side from the light transmitting portion 44.

Note that the technical scope of the present invention is not restricted by the above-described embodiments, and can be variously changed within a range not deviating from the gist of the present invention. For example, while a liquid-crystal display device is exemplarily described as a display body in the above-described embodiments, this is not meant to be restrictive. The present invention may be applied to an organic electroluminescence display device, a plasma display, and so on.

Also in the above-described embodiments, the example is described in which the viewing angle extending film is bonded onto the second polarizing plate of the liquid-crystal display body. However, the viewing angle extending film and the liquid-crystal body may not be in contact with each other.

For example, another optical film, an optical component, or the like may be inserted between the viewing angle extending film and the liquid-crystal display body. Alternatively, the viewing angle extending film and the liquid-crystal display body may be positioned at distant locations. Furthermore, in the case of an organic electroluminescence display device, a plasma display, or the like, a polarizing plate is not necessary, and therefore a contact between the viewing angle extending film and a polarizing plate does not occur.

Furthermore, the structure may be such that at least one of an antireflective layer, a polarizing filter layer, an antistatic layer, an antiglare processing layer, and an antifouling layer is provided on the visual recognition side of the base material of any of the viewing angle extending films in the above-described embodiments. According to this structure, a function of reducing reflection of external light, a function of preventing attachment of dust and soiling, a function of preventing a flaw, and the like can be added depending on the type of layer provided to the visual recognition side of the base material, and deterioration with time in viewing angle performance can be prevented.

Other than the above, specific structures regarding the arrangements and shapes of the light transmitting portion and the light-shielding layer, the dimensions and material of each portion of the viewing angle extending film, manufacturing conditions in manufacturing process, and so on are not restricted to those in the above-described embodiments, and can be changed as appropriate.

INDUSTRIAL APPLICABILITY

The present invention can be used in various display devices, such as a liquid-crystal display device, an organic electroluminescence display device, and a plasma display.

REFERENCE SIGNS LIST 1, 67, 100, 155 liquid-crystal display device (display device)
2 backlight (light source)
4 liquid-crystal panel (light modulating element)
6 liquid-crystal display body (display body)
7, 50, 55, 57, 59, 68, 72, 77, 81, 91, 95, 101, 108, 112, 116 viewing angle extending film (light diffusing member, viewing angle extending member)
39 base material 40, 61, 64, 69, 73, 78, 82, 85, 88, 92, 96, 102, 109, 113, 117, 120, 122a, 122b, 124, 126, 128, 130, 132, 134, 136, 138, 141, 142, 143, 146, 150 light-shielding layer
40h, 61h, 64h, 69h, 78h, 82h, 85h, 88h, 102h, 109h, 113h, 117h, 120h1, 120h2, 122h, 124h, 126h, 128h, 130h, 132h, 134h, 136h, 138h, 143h, 148h, 149h, 150h, 153h opening
41 transparent resin layer (optically transparent material layer)
43, 103 hollow portion
44, 70, 93, 97, 104 light transmitting portion
45a, 62a, 65a, 74a, 106a, 140a, 145a, 147a, 152a first circle (first figure)
45b, 62b, 65b, 74b, 106b, 140b, 145b1, 145b2, 147b, 152b1, 152b2 second circle (second figure)
79a, 83a, 110a circle (first figure)
79b, 83b, 110b, 114b, 118b, 144b, 151b oval (second figure)
86a rectangle (first figure)
86b rectangle (second figure)
89a octagon (first figure)
89b octagon (second figure)
114a, 118a, 144a, 151a oval (first figure)
156 light scattering film (light scattering layer)

The invention claimed is:

1. A light diffusing member comprising: a base material with optical transparency; a plurality of light-shielding layers dotted on one surface of the base material; and an optically transparent material layer provided on the one surface of the base material and thicker than the light-shielding layers;
   wherein at least a light-shielding layer, which is part of the plurality of light-shielding layers, has a planar shape surrounded by a first figure and a second figure contained in the first figure or a planar shape surrounded by at least part of the first figure and at least part of the second figure arranged so as to be partially overlaid with the first figure, when viewed in a direction of a normal to the one surface of the base material,
   hollow portions are provided in a formation region of the light-shielding layers, each hollow portion being shaped so that a cross-sectional area obtained by cutting along a plane parallel to the one surface of the base material is large on the light-shielding layer side and is gradually decreased as being away from the light-shielding layer, and
   a part of the optically transparent material layer other than the hollow portions is taken as a light transmitting portion.

2. The light diffusing member according to claim 1, wherein the plurality of light-shielding layers are non-cyclically arranged when viewed in the direction of the normal to the one surface of the base material.

3. The light diffusing member according to claim 1, wherein dimensions of at least one light-shielding layer among the plurality of light-shielding layers are different from dimensions of other light-shielding layers.

4. A light diffusing member comprising: a base material with optical transparency; a light-shielding layer formed on one surface of the base material; a plurality of openings dotted in a formation region of the light-shielding layer; and an optically transparent material layer provided in the formation region of the plurality of openings and thicker than the light-shielding layer;
   wherein at least an opening, which is part of the plurality of openings, has a planar shape surrounded by a first figure and a second figure contained in the first figure or a planar shape surrounded by at least part of the first figure and at least part of the second figure arranged so as to be partially overlaid with the first figure, when viewed in a direction of a normal to the one surface of the base material,
   hollow portions are provided in a formation region of the light-shielding layer, each hollow portion being shaped so that a cross-sectional area obtained by cutting along a plane parallel to the one surface of the base material is large on the light-shielding layer side and is gradually decreased as being away from the light-shielding layer, and
   a part of the optically transparent material layer other than the hollow portions is taken as a light transmitting portion.

5. The light diffusing member according to claim 4, wherein the plurality of openings are non-cyclically arranged when viewed in the direction of the normal to the one surface of the base material.

6. The light diffusing member according to claim 4, wherein dimensions of at least one opening among the plurality of openings are different from dimensions of other openings.

7. The light diffusing member according to claim 1, wherein the first figure and the second figure have an identical shape.

8. The light diffusing member according to claim 1, wherein the second figure is concentrically arranged inside the first figure.

9. The light diffusing member according to claim 1, wherein the second figure is eccentrically arranged inside the first figure.

10. The light diffusing member according to claim 9, wherein positions of the second figure inside the first figure is irregular over the plurality of first figures.

11. The light diffusing member according to claim 1, wherein at least one of the first figure and the second figure has an isotropic shape.

12. The light diffusing member according to claim 1, wherein at least one of the first figure and the second figure has an anisotropic shape.

13. The light diffusing member according to claim 1, wherein a plurality of said second figures are arranged inside one said first figure.

14. The light diffusing member according to claim 13, wherein the plurality of second figures arranged inside one said first figure include the second figure in an isotropic shape and the second figure in an anisotropic shape.

15. The light diffusing member according to claim 1, wherein air is present in the hollow portions.

16. The light diffusing member according to claim 1, wherein a light scattering layer is provided at a position on a light emission side from the light transmitting portion.

17. The light diffusing member according to claim 1, wherein the light-shielding layers are made of a light absorptive material.

18. The light diffusing member according to claim 17, wherein the light absorptive material is configured of any of black resin, black ink, a metal simple substance, and a laminated film of a metal simple substance and a metal oxide.

19. The light diffusing member according to claim 1, wherein a tilt angle of a side surface of at least one light transmitting portion among a plurality of said light transmitting portions is different from a tilt angle of a side surface of other light transmitting portions.

20. The light diffusing member according to claim 1,
wherein the tilt angle of the side surface of at least one light transmitting portion among the plurality of said light transmitting portions is varied depending on a location.

21. A light diffusing member manufacturing method comprising:
a step of arranging a plurality of first figures in a dotted manner in a predetermined region;
a step of arranging a plurality of second figures so that the second figures are contained in the first figures or are partially overlaid with the first figures and designing a plurality of patterns each having a planar shape surrounded by at least part of the first figures and at least part of the second figures;
a step of forming a plurality of light-shielding layers corresponding to the patterns on one surface of a base material with optical transparency;
a step of forming a negative-type photosensitive resin layer with optical transparency on the one surface of the base material so as to cover the plurality of light-shielding layers;
a step of irradiating the negative-type photosensitive resin layer with diffused light from a surface opposite to the one surface of the base material where the light-shielding layers and the negative-type photosensitive resin layer are formed, through the base material in a non-formation region of the light-shielding layers; and
a step of developing the negative-type photosensitive resin layer irradiated with the diffused light and forming hollow portions in a formation region of the light-shielding layers in the negative-type photosensitive resin layer, each hollow portion being shaped so that a cross-sectional area obtained by cutting along a plane parallel to the one surface of the base material is large on the light-shielding layer side and is gradually decreased as being away from the light-shielding layer.

22. A light diffusing member manufacturing method comprising:
a step of arranging a plurality of first figures in a dotted manner in a predetermined region;
a step of arranging a plurality of second figures so that the second figures are contained in the first figures or are partially overlaid with the first figures and designing a plurality of patterns each having a planar shape surrounded by at least part of the first figures and at least part of the second figures;
a step of forming a plurality of light-shielding layers with a plurality of openings corresponding to the patterns on one surface of a base material with optical transparency;
a step of forming a negative-type photosensitive resin layer with optical transparency on the one surface of the base material so as to cover the plurality of openings;
a step of irradiating the negative-type photosensitive resin layer with diffused light from a surface opposite to the one surface of the base material where the light-shielding layers and the negative-type photosensitive resin layer are formed, through the base material of the openings; and
a step of developing the negative-type photosensitive resin layer irradiated with the diffused light and forming hollow portions in a formation region of the light-shielding layers in the negative-type photosensitive resin layer, each hollow portion being shaped so that a cross-sectional area obtained by cutting along a plane parallel to the one surface of the base material is large on the light-shielding layer side and is gradually decreased as being away from the light-shielding layer.

23. A display device comprising: a display body; and a viewing angle extending member provided on a visual recognition side of the display body, the member emitting light, with an angular distribution of light caused to enter from the display body being extended more than an angular distribution before the entrance of the light;
wherein the viewing angle extending member is configured of the light scattering member according to claim 1.

24. The display device according to claim 23,
wherein the display body has a light source and a light modulating element which modulates light from the light source, and
the light source emits light with directivity.

25. The display device according to claim 23,
wherein the display body is a liquid-crystal display element.

\* \* \* \* \*